(12) United States Patent
Itano et al.

(10) Patent No.: US 7,833,957 B2
(45) Date of Patent: Nov. 16, 2010

(54) REMOVING SOLUTION

(75) Inventors: Mitsushi Itano, Settsu (JP); Takashi Kanemura, Settsu (JP); Shingo Nakamura, Settsu (JP); Fumihiro Kamiya, Settsu (JP); Takehiko Kezuka, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 1001 days.

(21) Appl. No.: 10/525,249

(22) PCT Filed: Aug. 21, 2003

(86) PCT No.: PCT/JP03/10547

§ 371 (c)(1), (2), (4) Date: Aug. 8, 2005

(87) PCT Pub. No.: WO2004/019134

PCT Pub. Date: Mar. 4, 2004

(65) Prior Publication Data

US 2006/0138399 A1 Jun. 29, 2006

(30) Foreign Application Priority Data

Aug. 22, 2002 (JP) .............................. 2002-242392
Oct. 11, 2002 (JP) .............................. 2002-299657

(51) Int. Cl.
*C11D 7/50* (2006.01)

(52) U.S. Cl. ........................................ 510/175; 510/176

(58) Field of Classification Search ................. 510/175, 510/176
See application file for complete search history.

(56) References Cited

U.S. PATENT DOCUMENTS

| 5,763,375 | A |  | 6/1998 | Kezuka et al. |
|---|---|---|---|---|
| 5,905,063 | A | * | 5/1999 | Tanabe et al. ............... 510/176 |
| 5,972,862 | A |  | 10/1999 | Torii et al. |
| 6,033,993 | A |  | 3/2000 | Love, Jr. et al. |
| 6,068,788 | A |  | 5/2000 | Kezuka et al. |
| 6,150,282 | A |  | 11/2000 | Rath et al. |
| 6,250,317 | B1 | * | 6/2001 | Nakayama .................... 134/38 |
| 6,265,309 | B1 |  | 7/2001 | Gotoh et al. |
| 6,399,552 | B1 |  | 6/2002 | Lee et al. |
| 6,642,352 | B2 | * | 11/2003 | Suzuki et al. ........... 528/502 R |
| 6,831,048 | B2 |  | 12/2004 | Kezuka et al. |
| 7,052,627 | B1 | * | 5/2006 | Kezuka et al. .............. 252/79.1 |
| 2001/0038976 | A1 | * | 11/2001 | Tanabe et al. ................ 430/325 |
| 2002/0058397 | A1 |  | 5/2002 | Smith et al. |
| 2005/0003977 | A1 | * | 1/2005 | Itano et al. .................... 510/175 |
| 2006/0178282 | A1 | * | 8/2006 | Suyama et al. ............... 510/175 |

FOREIGN PATENT DOCUMENTS

| EP | 0805484 A1 | 11/1997 |
|---|---|---|
| EP | 0859404 A2 | 8/1998 |
| EP | 1150342 A1 | 10/2001 |
| EP | 1 277 830 A1 | 1/2003 |
| JP | 1-146331 | 6/1989 |
| JP | 7-302744 | 11/1995 |
| JP | 7-302744 A | 11/1995 |
| JP | 10-50647 | 2/1998 |
| JP | 10055993 A | 2/1998 |
| JP | 11-340183 | 12/1999 |
| JP | 2000-56479 | 2/2000 |
| JP | 2000-56479 A | 2/2000 |
| JP | 2001-517863 A | 10/2001 |
| JP | 2001-330970 | 11/2001 |
| JP | 2001-330970 A | 11/2001 |
| JP | 3255551 | 11/2001 |
| JP | 2002-110632 | 4/2002 |
| JP | 2002-110632 A | 4/2002 |
| JP | 2002-169305 A | 6/2002 |
| KR | 2001-0101200 | 11/2001 |
| WO | 0101474 A1 | 1/2001 |
| WO | WO 01/29284 A1 | 4/2001 |
| WO | WO 01/33613 A2 | 5/2001 |
| WO | 0171429 A1 | 9/2001 |
| WO | WO 01/74985 A1 | 10/2001 |
| WO | 0181525 A1 | 11/2001 |

* cited by examiner

*Primary Examiner*—Gregory E Webb
(74) *Attorney, Agent, or Firm*—Sughrue Mion, PLLC

(57) ABSTRACT

The present invention provides a resist-removing solution for low-k film and a cleaning solution for via holes or capacitors, the solutions comprising hydrogen fluoride (HF) and at least one member selected from the group consisting of organic acids and organic solvents. The invention also provides a method of removing resist and a method of cleaning via holes or capacitors by the use of the solutions.

41 Claims, No Drawings

REMOVING SOLUTION

TECHNICAL FIELD

The present invention relates to a resist-removing solution for low-k film and a cleaning solution for via holes or capacitors.

BACKGROUND ART

In recent years a technology has been developed to use low-k film (low dielectric constant film), which exhibits a low relative dielectric constant, in place of $SiO_2$ film in semiconductor devices. With this technological development, it has become necessary to etch low-k film in the production process of semiconductor devices. Conventionally, after the film is subjected to dry etching, $O_2$ plasma ashing is performed to remove the resist; however, such a treatment may damage low-k film. It is, therefore, desirable to remove resist with a chemical solution, without $O_2$ plasma ashing (or after carrying out $H_2$ plasma ashing or light $O_2$ plasma ashing). However, the resist-removing solutions proposed heretofore cannot be used for such a purpose because they fail to remove the resist (for example, KRF (Krypton F) resist) itself formed on low-k film while they etch the low-k film.

In the production process of a semiconductor device, after forming via holes, titanium compounds and/or polymers may remain on the sidewalls and/or the bottoms of the via holes. The development of a composition is therefore desired that can be used to remove such titanium compounds and/or polymers from via holes.

Furthermore, in the formation of a metal capacitor in the semiconductor device production process, polymers, resist residue, and titanium compounds may remain after the dry etching of an upper or lower electrode metal film (TiN, Ti, etc.) of the metal capacitor. The development of a composition is therefore desired that can be used to remove such polymers, resist residue, and titanium compounds.

Until recently, semiconductor devices with an $Al/SiO_2$ multilevel interconnection structure have mainly been produced, which use aluminum, aluminum alloy or the like as a wiring material, and a $SiO_2$ film as an interlayer dielectric. In order to reduce the wiring delay caused by the microminiaturization of devices, semiconductor devices with a Cu/low-k multilevel interconnection structure are now being developed, which use Cu as a wiring material having low resistance; and low-k film (low dielectric constant film) as an interlayer dielectric having low interconnect capacitance, in place of the $SiO_2$ film.

In the $Al/SiO_2$ multilevel interconnection structure, wiring layers and via layers are separately formed; the wiring layers supplying electric current horizontally to a processed wafer; and the via layers forming the wiring through vertical holes that connect the wiring layers. Each wiring layer is formed by producing convex metal wiring (such as Al) by metal dry etching, and depositing an interlayer dielectric such as $SiO_2$ film to embed the wiring. After the deposition of an interlayer dielectric such as $SiO_2$ film, the via layer is formed by subjecting the interlayer dielectric to dry etching to form a hole (via hole), and filling the hole with a metal such as Al or W.

The Cu/low-k multilevel interconnection structure is produced by a process called damascene, wherein the wiring structure is obtained by forming a trench or a hole (via hole) in low-k film by dry etching, and then filling the trench or hole with a wiring material such as copper. In the method called dual damascene, trenches for wiring and via holes are formed in low-k film at the same time, and then filled with a wiring material such as copper. A dual damascene structure can be formed by a via-first process, wherein the via holes are formed prior to the trenches for wiring; or conversely, by a trench-first process, wherein the trenches for wiring are formed prior to the via holes; or by other processes such as a middle-first process or a dual hard mask process. In the dual damascene process or the like, a filling material is used in many cases. In the via-first process, for example, via holes are formed by dry etching and then filled with a filling material, followed by lithography and etching for the formation of trenches. Thereafter the filling material must be selectively removed.

In the $Al/SiO_2$ multilevel interconnection structure, the metal etching for the formation of wiring uses a gas such as chlorine or hydrogen bromide, and the via etching for the formation of via holes uses a mixed gas of fluorocarbon gas, hydrofluorocarbon gas, an inert gas such as Ar, oxygen, an oxygen-containing gas such as carbon monoxide, etc. After metal etching or the via etching of the interlayer dielectric for via hole formation, ashing is performed using an oxygen-containing plasma to remove unnecessary substances such as resist and etching residues. The residue remaining after ashing is removed using a removing solution. In the case of metal etching, the residue consists of oxides of aluminum, etc., that contain a small amount of organic substances such as resist. Since this residue is formed on the sidewalls of aluminum wiring, it may be referred to as "sidewall polymer," "rabbit ear," and so on. In the case of via etching, the residue consists of oxides or fluorides of Ti, TiN, or other metal barrier films that contain a small amount of organic substances such as resist and fluorocarbon polymers. This residue may also be referred to as "sidewall polymer." In many cases the residue after metal or via hole etching is subjected to an ashing treatment until the resist is removed using oxygen plasma, with the result that the principal component of the etching residue is an oxide that has been made inorganic.

In the Cu/low-k multilevel interconnection structure, by contrast, the damascene structure of a trench or a via hole in low-k film is formed by dry etching using a fluorocarbon gas mixed with nitrogen, etc. The use of nitrogen in the dry etching gas enhances processing accuracy. However, reaction of the gas with low-k film containing silicon forms a residue of nonvolatile nitrided silicon. If ashing is completely performed using an oxygen-containing plasma to remove the resist and residue after etching, the low-k film will be damaged, causing a change in dielectric constant. This kind of plasma ashing, therefore, is not performed in many cases; instead, ashing may be carried out with a plasma of hydrogen, nitrogen, noble gas, a mixture of these gases, or the like, or light ashing may be carried out with an oxygen-containing plasma. Also, in many cases, to minimize the damage to the low-k film, the resist and filling material are not completely removed by ashing. If a nitrogen-containing gas is used for plasma ashing, the residue contains further nitrided silicon in a large amount. In such a case, even after ashing, a relatively large amount of resist, antireflection coating, filling material, and nitrogen-containing etching residue such as silicone nitride are present. Even if ashing is carried out to a considerable extent, it is difficult to remove all of the resist, antireflection coating, and filling material. As a result, the principal component of the residue present after etching in the damascene process is an organic substance that originates in the resist, antireflection coating, filling material, and fluorocarbon polymer, and contains an inorganic substance such as silicon nitride.

There have been many patent applications filed for removing solutions that can be used to remove the mineralized residue produced by dry etching in the process of forming an Al/SiO$_2$ multilevel interconnection structure; and for cleaning solutions that can be used to clean the formed pattern. Japanese. Unexamined Patent Publication No. 1989-146331 discloses a cleaning solution obtained by mixing hydrofluoric acid with an organic solvent such as isopropanol, and mentions that this cleaning solution enhances wettability and uniformity in cleaning. However, it does not refer to the removal of dry etching residue or resist, which the present invention deals with. Japanese Patent No. 3255551 discloses a resist-removing composition that contains at least one anti-corrosive selected from the group consisting of HF, water-soluble organic solvents, aromatic hydroxy compounds, acetylene alcohols, carboxyl-containing organic compounds and anhydrides thereof, and triazole compounds. It mentions sulfoxides, amides, polyhydric alcohols, etc., as effective organic solvents. According to Japanese Unexamined Patent Publication No. 1998-50647, after the formation of a contact hole, the contact hole is cleaned by carefully etching the native oxide at the bottom of the contact hole and the oxide on the sidewalls thereof containing pollutants such as etching residues and metal substances. It discloses that when a contact hole formed by penetrating three kinds of films, i.e., a plasma silicon oxide film, a low-pressure chemical vapor deposition silicon oxide film, and a BPSG film, is cleaned in a mixed solution of a low concentration (about 0.25% to about 0.5% by weight) of hydrogen fluoride, isopropanol, and DIW (deionized water), the contact hole obtains an uniform profile without level differences. U.S. Pat. No. 6,150,282 discloses the use of hydrogen fluoride and an organic solvent for providing a cleaning solution and a cleaning method for etching residue after the formation of a via hole in a silicon oxide film. It discloses a method of removing and etching at least one of a mask, an etching residue, a silicon oxide film, and a silicon nitride film, using a removing solution containing hydrogen fluoride, an organic solvent, and water. Japanese Unexamined Patent Publication No. 1999-340183 discloses a cleaning solution containing 20% or less by weight of hydrogen fluoride, an alcohol with a dielectric constant of 10 or more, etc., which can be used for cleaning after via hole etching or for removing sidewall polymers after the dry etching of metal wiring while inhibiting the corrosion of the metal wiring of aluminum, etc.

The above inventions, however, do not consider the use of low-k film as an interlayer dielectric, and copper as a wiring material. They are intended to remove inorganic residue after dry etching or to clean the formed pattern, in the formation of an Al/SiO$_2$ multilevel interconnection structure.

A principal object of the present invention is to provide a resist-removing solution for low-k film, a cleaning solution for via holes, and a cleaning solution for metal capacitors.

DISCLOSURE OF THE INVENTION

The present invention is aimed at removing or stripping resist, antireflection coatings, filling materials, and etching residues including these, after dry etching for the formation of a Cu/low-k multilevel interconnection structure. The object to be removed in the present invention differs from that in the case of the Al/SiO$_2$ multilevel interconnection structure. When using low-k film as an interlayer dielectric, the etching residue contains a high proportion of organic substances such as resist, an antireflection coating, and a filling material, and also contains the residue of nitrided silicon such as SiN. In order to remove such residue, a removing solution that contains a large amount of organic compounds and that selectively dissolves silicon nitrides is required. The present inventors have confirmed that the effect of selectively dissolving silicon nitrides in the removing solution can be evaluated based on the effect of selectively etching silicon nitride (SiN) films. That is, a removing solution that is more capable of selectively etching silicon nitride (SiN) films, can better dissolve silicon nitrides in etching residue, thus removing the residue more effectively. Moreover, copper is used as a wiring material in low-k film. Therefore, the removing solution must not etch copper. No removing solutions have ever been developed that meet these demands.

The removing solution of the present invention comprises a mixed solution of hydrogen fluoride, an organic acid and/or an organic solvent, and is capable of controlling the etching of wiring metals such as copper, insulating film barriers, low-k film, and etching residue. Specifically, the removing solution of the invention has the following features:

(1) it inhibits the corrosion of metals such as copper;

(2) it selectively etches insulating film barriers to separate etching residue from the insulating film barriers or low-k film;

(3) it selectively dissolves silicon nitride (SiN), etc., contained in etching residue; and (4) with an organic solvent it dissolves organic components in etching residue.

These features allow the etching solution of the present invention to remove etching residue.

In the present invention, for example, a removing solution composed of hydrogen fluoride, isopropanol, and water shows its greatest effects when the weight ratio of hydrogen fluoride/isopropanol/water is in the range of 1.00-5.00 mass %/87.00-98.5 mass %/0.50-8.00 mass %.

There have been many patent applications filed for cleaning solutions and removing solutions containing hydrogen fluoride, an organic solvent such as isopropanol, and water. The solutions disclosed in these applications are not used to form a Cu/low-k multilevel interconnection structure, but to form an Al/SiO$_2$ multilevel interconnection structure; and they are intended to remove different objects from that of the present invention. Such solutions are described below.

Japanese Unexamined Patent Publications No. 1989-146331 and No. 1998-50647 disclose similar cleaning solutions of hydrogen fluoride, isopropanol, and water. In these, however, the hydrogen fluoride concentration is 0.5% or less by weight, and they cannot selectively etch an insulating film barrier nor a silicon nitride (SiN) film, so that they have a poor ability to remove resist, antireflection coatings, filling materials, and etching residue. In particular, the invention of Japanese Unexamined Patent Publication No. 1998-50647 is intended to provide a uniform profile without level differences when cleaning a contact hole, and it is characterized by almost the same etching speeds for the plasma silicon oxide film, low-pressure chemical vapor deposition silicon oxide film, and BPSG film that are used in the invention.

In clear contrast to this, the present invention is characterized by selectively etching an insulating film barrier and a silicon nitride (SiN) film over low-k film. When the removing solution of the present invention is used to etch a plasma silicon oxide film, a low-pressure chemical vapor deposition silicon oxide film, and a BPSG film, an extremely large amount of the BPSG film is etched in the same manner as silicon nitride is etched.

According to Japanese Patent No. 3255551, effective organic solvents are sulfoxides, amides, polyhydric alcohols, etc. However, polyhydric alcohols do not have much effect on selectively etching silicon nitride (SiN) over low-k film. Sulfoxides and amides tend to heavily corrode copper, and particularly dimethyl sulfoxide, which is used in the examples, causes extremely heavy corrosion of copper. From the use of anticorrosives, it is obvious that copper is not intended as a wiring material. In the present invention, by contrast, an organic solvent that does not need any anticorrosives is used. The removing solution of Japanese Patent No. 3255551 is not used to form a Cu/low-k multilevel interconnection structure.

The composition of U.S. Pat. No. 6,150,282 contains substantially no water, thus causing little metal corrosion. In the present invention, by contrast, when silicon nitride (SiN) is contained in etching residue, water is required. This is because without water, silicon nitride (SiN) cannot be selectively removed over low-k film. Moreover, the organic solvents used in the present invention cause little corrosion of copper even when the amount of water is not minimized. Isopropanol, which was previously mentioned, is one example of such organic solvents. In U.S. Pat. No. 6,150,282, the amount of water must be reduced in order to prevent the corrosion of the metals used for the formation of an $Al/SiO_2$ multilevel interconnection structure, such as aluminum. Obviously, the composition of U.S. Pat. No. 6,150,282 is not intended as a removing solution for forming a Cu/low-k multilevel interconnection structure.

U.S. Pat. No. 6,150,282 discloses the use of oxolanes, sulfolanes, esters, ketones, aldehydes, lactones, halogenated hydrocarbons, alcohols, amines, imides, etc., as organic solvents. However, it does not disclose the use of water-soluble organic solvents, which is important for a removing solution used for forming a Cu/low-k multilevel interconnection structure. In the case of a water-soluble organic solvent, the removing solution remaining on the substance that has been treated with the solution can be removed by simply using pure water without intermediate rinsing. When the removing solution of the present invention removes resist, antireflection coatings, filling materials, and etching residues including these, it also slightly and uniformly etches the insulating film barriers and low-k film that are in contact with them. In this case, when the organic solvent is water-insoluble, the surface of an insulating film barrier or low-k film becomes rough, resulting in an undesirable form after removal treatment. It is thus desirable that the organic solvent used in a removing solution for forming a Cu/low-k multilevel interconnection structure be water-soluble. However, this is not disclosed in U.S. Pat. No. 6,150, 282. For these reasons, halogenated hydrocarbons, which are nonaqueous solvents; and water-insoluble oxolanes, sulfolanes, esters, ketones, aldehydes, lactones, alcohols, amines, and imides, are difficult to use in a removing solution for the formation of a Cu/low-k multilevel interconnection structure.

The use of sulfolanes, amines, and imides causes copper corrosion. When alcohols are used, although alcohols having one OH group are considered to be desirable, methanol corrodes copper. Ethanol corrodes copper more heavily than isopropanol does. In the present invention, methanol and ethanol are not used singly, but they can be used in combination with other organic solvents.

On the other hand, water-soluble alcohols having three or more carbon atoms, such as propanol and t-butanol, cause little corrosion of copper, and allow the removal of the remaining removing solution after the removal treatment, simply by rinsing with pure water, thus achieving an efficient removal treatment with a small number of steps. The present inventors found that water-soluble alcohols having three or more carbon atoms, such as propanol and t-butanol, are useful for forming Cu/low-k multilevel interconnection structures. U.S. Pat. No. 6,150,282 does not mention such a fact, and includes many removing solutions that are unsuitable for forming Cu/low-k multilevel interconnection structures. The present invention also discloses that preferable esters and ketones are water-soluble, and that methyl acetate, ethyl acetate, butyl acetate, acetone, etc. are highly effective in selectively etching silicon nitride (SiN) over low-k film, and are therefore the most suitable esters and ketones for effectively removing resist, antireflection coatings, and etching residues including these for forming a Cu/low-k multilevel interconnection structure. U.S. Pat. No. 6,150,282, however, does not mention any specific organic solvents that are useful in a removing solution for forming a Cu/low-k multilevel interconnection structure.

The invention of Japanese Unexamined Patent Publication No. 1998-340183 is characterized by using a cleaning solution containing 20% or less by weight of hydrogen fluoride, an alcohol (R—OH) with a dielectric constant of 10 or more, etc., to provide a sidewall polymer removing solution that causes little metal corrosion. Based on R—OH+2HF->(R—OH)H$^+$+HF$_2^-$, HF is slightly dissociated, generating a small amount of HF$_2^-$ ions. The resulting small amount of HF$_2^-$ ions function to remove sidewall polymers and inhibit a reaction with aluminum. In the present invention, by contrast, an organic solvent such as an alcohol dissociates a hydrogen bond polymer (HF)$_n$, allowing HF and the proton H$^+$ supplied from HF and (HF)$_n$ (wherein n is 2 or more) to selectively etch an insulating film barrier and a silicon nitride (SiN) film over low-k film, thus removing etching residue.

Japanese Unexamined Patent Publication No. 1999-340183 discloses methanol as an organic solvent that is effective as a sidewall polymer removing solution in its examples. In many cases, the sidewall polymer produced in the formation of aluminum wiring in an $Al/SiO_2$ multilevel interconnection structure is made inorganic by ashing. The speed of etching an alumina film ($Al_2O_3$ film) can be used as an index for the removal of this polymer. The faster this film is etched, the more easily the sidewall polymer can be removed. As shown in the examples, when methanol is used, the $Al_2O_3$ etching speed is higher, and the effect of removing the sidewall polymer of aluminium wiring is greater, than when isopropanol is used. The silicon nitride (SiN) film can be more selectively etched with methanol than with isopropanol. However, copper is much more heavily corroded with methanol than with isopropanol.

Japanese Unexamined Patent Publication No. 1999-340183 does not disclose that other solvents such as isopropanol are effective for inhibiting copper corrosion. The resist, antireflection coating, etching residues including these, etc., removed in the formation of the Cu/low-k multilevel interconnection structure contains organic substances in a large amount. Furthermore, Japanese Unexamined Patent Publication No. 1999-340183 does not disclose that these organic substances can be more easily dissolved and removed, using isopropanol rather than methanol. These indicate that Japanese Unexamined Patent Publication No. 1999-340183 does not provide a removing solution used for the formation of a Cu/low-k multilevel interconnection structure.

In a removing solution comprising hydrogen fluoride, an organic solvent, and water, the present invention uses an organic acid and/or an organic solvent (such as isopropanol and acetic acid) that cause little corrosion of copper and that selectively etch a silicon nitride (SiN) film over low-k film, thus providing a useful removing solution for the formation of a Cu/low-k multilevel interconnection structure.

The present invention relates to the following removing solutions and removing methods, cleaning solutions and cleaning methods, etc.

Item 1: A resist-removing solution for low-k film comprising hydrogen fluoride (HF) and at least one member selected from the group consisting of organic acids and organic solvents.

Item 2: A resist-removing solution according to item 1, further comprising at least one member selected from the group consisting of ammonia and amines.

Item 3: A removing solution according to item 1, wherein the solution is used for ultrasonic cleaning.

Item 4: A removing solution according to item 1, wherein the low-k film has a dielectric constant greater than 1 but not greater than 3.

Item 5: A removing solution according to item 1, whereby a SiN film can be etched to a depth of at least 1 Å.

Item 6: A removing solution according to item 1, wherein the organic acids or organic solvents have an SP value of 7 to 17.

Item 7: A removing solution according to item 1, wherein the concentration of HF is in the range of 0.01 to 10 mass %.

Item 8: A removing solution according to item 1, wherein said at least one member selected from the group consisting of organic acids and organic solvents is organic acid(s) or a mixture of organic acid(s) and organic solvent(s); and the concentration of HF is in the range of 0.01 to 5 mass %.

Item 9: A removing solution according to item 1, wherein said at least one member selected from the group consisting of organic acids and organic solvents is organic solvent(s); and the concentration of HF is in the range of 0.01 to 10 mass %.

Item 10: A removing solution according to item 1, further comprising water, wherein the weight ratio of HF/organic acid/water is in the range of 0.01 to 5 mass %/49 to 99.9 mass %/0 to 50 mass %; and the organic acid is at least one member selected from the group consisting of monocarboxylic acids, sulfonic acids, and polycarboxylic acids.

Item 11: A removing solution according to item 10, wherein the monocarboxylic acids are at least one member selected from the group consisting of acetic acid, propionic acid, butyric acid, isobutyric acid, valeric acid, caproic acid, caprylic acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, methacrylic acid, and acrylic acid;

the sulfonic acids are at least one member selected from the group consisting of methanesulfonic acid, benzenesulfonic acid, trifluoromethanesulfonic acid, and toluenesulfonic acid; and the polycarboxylic acids are at least one member selected from the group consisting of oxalic acid, succinic acid, adipic acid, tartaric acid, and citric acid.

Item 12: A removing solution according to item 9, further comprising water, wherein the weight ratio of HF/organic solvent/water is in the range of 0.01 to 10 mass %/49 to 99.9 mass %/0 to 50 mass %; and the organic solvent is at least one member selected from the group consisting of monohydric alcohols, polyols, ketones, amides, nitrites, aldehydes, alkylene glycol monoalkyl ethers, ethers, esters, hydrocarbons, halogen compounds, fluorinated alcohols, phosphate esters, and nitrogen-containing compounds.

Item 13: A removing solution according to item 2, wherein the weight ratio of HF/said at least one member selected from the group consisting of ammonia and amines/organic solvents/water is in the range of 0.01 to 10 mass %/0.01 to 30 mass %/49 to 99.9 mass %/0 to 50 mass %; and the organic solvent is at least one member selected from the group consisting of monohydric alcohols, polyols, ketones, amides, nitriles, aldehydes, alkylene glycol monoalkyl ethers, ethers, esters, hydrocarbons, halogen compounds, fluorinated alcohols, phosphate esters, and nitrogen-containing compounds.

Item 14: A removing solution according to item 12, wherein the monohydric alcohols are at least one member selected from the group consisting of methanol, ethanol, isopropanol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonyl alcohol, 1-decanol, 1-dodecanol, lauryl alcohol, and cyclohexanol, with the proviso that methanol and ethanol are used in combination with other organic solvent(s) or organic acid(s);

the polyols are at least one member selected from the group consisting of ethylene glycol, diethylene glycol, 1,2-propanediol, propylene glycol, 2,3-butanediol, and glycerin;

the ketones are at least one member selected from the group consisting of acetone, acetylacetone, methyl ethyl ketone, methyl isobutyl ketone, cyclohexanone, diethyl ketone, and diisobutyl ketone;

the amides are at least one member selected from the group consisting of N-methylformamide, N,N-dimethylformamide, N-methylacetamide, and N,N-dimethylacetamide;

the nitriles are at least one member selected from the group consisting of acetonitrile, propionitrile, butyronitrile, isobutyronitrile, and benzonitrile;

the aldehydes are at least one member selected from the group consisting of formaldehyde, acetaldehyde, and propionaldehyde;

the alkylene glycol monoalkyl ethers are at least one member selected from the group consisting of ethylene glycol monomethyl ether and ethylene glycol monoethyl ether;

the ethers are at least one member selected from the group consisting of tetrahydrofuran, dioxane, diisopropyl ether, dibutyl ether, tetrahydropyran, anisole, 1,2-dimethoxyethane, and diethylene glycol dimethyl ether;

the esters are at least one member selected from the group consisting of methyl acetate, ethyl acetate, propyl acetate, isopropyl acetate, butyl acetate, isobutyl acetate, pentyl acetate, hexyl acetate, methyl propionate, ethyl propionate, propyl propionate, isopropyl propionate, butyl propionate, isobutyl propionate, pentyl propionate, hexyl propionate, methyl butyrate, ethyl butyrate, propyl butyrate, isopropyl butyrate, butyl butyrate, isobutyl butyrate, pentyl butyrate, hexyl butyrate, methyl isobutyrate, ethyl isobutyrate, propyl isobutyrate, isopropyl isobutyrate, butyl isobutyrate, isobutyl isobutyrate, pentyl isobutyrate, hexyl isobutyrate, methyl valerate, ethyl valerate, propyl valerate, isopropyl valerate, butyl valerate, isobutyl valerate, pentyl valerate, hexyl valerate, methyl isovalerate, ethyl isovalerate, propyl isovalerate, isopropyl isovalerate, butyl isovalerate, isobutyl isovalerate, pentyl isovalerate, hexyl isovalerate, methyl caproate, ethyl caproate, propyl caproate, isopropyl caproate, butyl caproate, isobutyl caproate, pentyl caproate, hexyl caproate, methyl caprylate, ethyl caprylate, propyl caprylate, isopropyl caprylate, butyl caprylate, isobutyl caprylate, pentyl caprylate, hexyl caprylate, methyl octanoate, ethyl octanoate, propyl octanoate, isopropyl octanoate, butyl octanoate, isobutyl octanoate, pentyl octanoate, hexyl octanoate, methyl nonanoate, ethyl nonanoate, propyl nonanoate, isopropyl nonanoate, butyl nonanoate, isobutyl nonanoate, pentyl nonanoate, hexyl nonanoate, methyl decanoate, ethyl decanoate, propyl decanoate, isopropyl decanoate, butyl decanoate, isobutyl decanoate, pentyl decanoate, hexyl decanoate, methyl dodecanoate, ethyl dodecanoate, propyl dodecanoate, isopropyl dodecanoate, butyl dodecanoate, isobutyl dodecanoate, pentyl dodecanoate, hexyl dodecanoate, methyl laurate, ethyl laurate, propyl laurate, isopropyl laurate, butyl laurate, isobutyl laurate, pentyl laurate, hexyl laurate, methyl acrylate, ethyl acrylate, propyl acrylate, isopropyl acrylate, butyl acrylate, isobutyl acrylate, pentyl acrylate, hexyl acrylate, monomethyl oxalate, dimethyl oxalate, monoethyl oxalate, diethyl oxalate, monopropyl oxalate, dipropyl oxalate, monobutyl oxalate, dibutyl oxalate, monomethyl succinate, dimethyl succinate, monoethyl succinate, diethyl succinate, monopropyl succinate, dipropyl succinate, monobutyl succinate, dibutyl succinate, monomethyl adipate, dimethyl adipate, monoethyl adipate, diethyl adipate, monopropyl adipate, dipropyl adipate, monobutyl adipate, dibutyl adipate, monomethyl tartrate, dimethyl tartrate, monoethyl tartrate, diethyl tartrate, monopropyl tartrate, dipropyl tartrate, monobutyl tartrate, dibutyl tartrate, monomethyl citrate, dimethyl citrate, monoethyl citrate, diethyl citrate, monopropyl citrate, dipropyl citrate, monobutyl citrate, dibutyl citrate, dimethyl phthalate, diethyl phthalate, dipropyl phthalate, dibutyl phthalate, dipentyl phthalate, dihexyl phthalate, diheptyl phthalate, dioctyl phthalate, dinonyl phthalate, didecyl phthalate, didodecyl phthalate, dimethyl terephthalate, diethyl terephthalate, dipropyl terephthalate, dibutyl terephthalate, dipentyl terephthalate, dihexyl terephthalate, diheptyl terephthalate, dioctyl terephthalate, dinonyl terephthalate, didecyl terephthalate, didodecyl terephthalate, propylene carbonate, and γ-butyrolactone;

the hydrocarbons are at least one member selected from the group consisting of hexane, cyclohexane, octane, isooctane, benzene, and toluene;

the halogen compounds are at least one member selected from the group consisting of chloroform, o-dichlorobenzene, perfluorohexane, and perfluoromethylcyclohexane;

the fluorinated alcohols are at least one member selected from the group consisting of trifluoroethanol, pentafluoropropanol, and 2,2,3,3-tetrafluoropropanol;

the phosphate esters are at least one member selected from the group consisting of dimethyl phosphate, dibutyl phosphate, diphenyl phosphate, dibenzyl phosphate, trimethyl phosphate, triethyl phosphate, tripropyl phosphate, tributyl phosphate, and triphenyl phosphate; and the nitrogen-containing compounds are at least one member selected from the group consisting of tetramethylurea and N-methyl-2-pyrrolidone.

Item 15: A method of removing resist, comprising treating an object having resist on the surface of a low-k film or on an antireflection coating (BARC) over a low-k film, by the use of the removing solution of item 1 under temperature and time conditions such that the resist can be removed without substantially damaging the low-k film.

Item 16: A method according to item 15, comprising an ashing treatment for the resist without substantially damaging the low-k film, before treating the object using the removing solution.

Item 17: A method according to item 15, wherein the low-k film is substantially undamaged because the low-k film is substantially unetched and/or the dielectric constant of the low-k film is substantially unchanged before and after the treatment.

Item 18: A method according to item 15, comprising treating the object while performing ultrasonic cleaning.

Item 19: A resist-removed object that can be obtained according to the method of item 15.

Item 20: A cleaning solution for a via hole or a capacitor comprising hydrogen fluoride (HF) and at least one member selected from the group consisting of organic acids and organic solvents.

Item 21: A cleaning solution according to item 20, further comprising at least one member selected from the group consisting of ammonia and amines.

Item 22: A removing solution according to item 20, wherein the solution is used for ultrasonic cleaning.

Item 23: A cleaning solution according to item 20, whereby a TiN film can be etched to a depth of at least 0.01 Å.

Item 24: A cleaning solution according to item 20, further comprising water, wherein the weight ratio of HF/organic acid/water is in the range of 0.01 to 5 mass %/49 to 99.9 mass %/0 to 50 mass %; and the organic acid is at least one member selected from the group consisting of monocarboxylic acids, sulfonic acids, and polycarboxylic acids.

Item 25: A cleaning solution according to item 24, wherein the monocarboxylic acids are at least one member selected from the group consisting of acetic acid, propionic acid, butyric acid, isobutyric acid, valeric acid, caproic acid, caprylic acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, methacrylic acid, and acrylic acid;

the sulfonic acids are at least one member selected from the group consisting of methanesulfonic acid, benzenesulfonic acid, trifluoromethanesulfonic acid, and toluenesulfonic acid; and the polycarboxylic acids are at least one member selected from the group consisting of oxalic acid, succinic acid, adipic acid, tartaric acid, and citric acid.

Item 26: A cleaning solution according to item 20, further comprising water, wherein the weight ratio of HF/organic solvent/water is in the range of 0.01 to 10 mass %/49 to 99.9 mass %/0 to 50 mass %; and the organic solvent is at least one member selected from the group consisting of monohydric alcohols, polyols, ketones, amides, nitriles, aldehydes, alkylene glycol monoalkyl ethers, ethers, esters, hydrocarbons, halogen compounds, fluorinated alcohols, phosphate esters, and nitrogen-containing compounds.

Item 27: A cleaning solution according to item 21, wherein the weight ratio of HF/said at least one member selected from the group consisting of ammonia and amines/organic solvent/water is in the range of 0.01 to 10 mass %/0.01 to 30 mass %/49 to 99.9 mass %/0 to 50 mass %; and the organic solvent is at least one member selected from the group consisting of monohydric alcohols, polyols, ketones, amides, nitriles, aldehydes, alkylene glycol monoalkyl ethers, ethers, esters, hydrocarbons, halogen compounds, fluorinated alcohols, phosphate esters, and nitrogen-containing compounds.

Item 28: A cleaning solution according to item 26, wherein the monohydric alcohols are at least one member selected from the group consisting of methanol, ethanol, isopropanol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonyl alcohol, 1-decanol, 1-dodecanol, lauryl alcohol, and cyclohexanol;

the polyols are at least one member selected from the group consisting of ethylene glycol, diethylene glycol, 1,2-propanediol, propylene glycol, 2,3-butanediol, and glycerin;

the ketones are at least one member selected from the group consisting of acetone, acetylacetone, methyl ethyl ketone, methyl isobutyl ketone, cyclohexanone, diethyl ketone, and diisobutyl ketone;

the amides are at least one member selected from the group consisting of N-methylformamide, N,N-dimethylformamide, N-methylacetamide, and N,N-dimethylacetamide;

the nitriles are at least one member selected from the group consisting of acetonitrile, propionitrile, butyronitrile, isobutyronitrile, and benzonitrile;

the aldehydes are at least one member selected from the group consisting of formaldehyde, acetaldehyde, and propionaldehyde;

the alkylene glycol monoalkyl ethers are at least one member selected from the group consisting of ethylene glycol monomethyl ether and ethylene glycol monoethyl ether;

the ethers are at least one member selected from the group consisting of tetrahydrofuran, dioxane, diisopropyl ether, dibutyl ether, tetrahydropyran, anisole, 1,2-dimethoxyethane, and diethylene glycol dimethyl ether;

the esters are at least one member selected from the group consisting of methyl acetate, ethyl acetate, propyl acetate, isopropyl acetate, butyl acetate, isobutyl acetate, pentyl acetate, hexyl acetate, methyl propionate, ethyl propionate, propyl propionate, isopropyl propionate, butyl propionate, isobutyl propionate, pentyl propionate, hexyl propionate, methyl butyrate, ethyl butyrate, propyl butyrate, isopropyl butyrate, butyl butyrate, isobutyl butyrate, pentyl butyrate, hexyl butyrate, methyl isobutyrate, ethyl isobutyrate, propyl isobutyrate, isopropyl isobutyrate, butyl isobutyrate, isobutyl isobutyrate, pentyl isobutyrate, hexyl isobutyrate, methyl valerate, ethyl valerate, propyl valerate, isopropyl valerate, butyl valerate, isobutyl valerate, pentyl valerate, hexyl valerate, methyl isovalerate, ethyl isovalerate, propyl isovalerate, isopropyl isovalerate, butyl isovalerate, isobutyl isovalerate, pentyl isovalerate, hexyl isovalerate, methyl caproate, ethyl caproate, propyl caproate, isopropyl caproate, butyl caproate, isobutyl caproate, pentyl caproate, hexyl caproate, methyl caprylate, ethyl caprylate, propyl caprylate, isopropyl caprylate, butyl caprylate, isobutyl caprylate, pentyl caprylate, hexyl caprylate, methyl octanoate, ethyl octanoate, propyl octanoate, isopropyl octanoate, butyl octanoate, isobutyl octanoate, pentyl octanoate, hexyl octanoate, methyl nonanoate, ethyl nonanoate, propyl nonanoate, isopropyl nonanoate, butyl nonanoate, isobutyl nonanoate, pentyl nonanoate, hexyl nonanoate, methyl decanoate, ethyl decanoate, propyl decanoate, isopropyl decanoate, butyl decanoate, isobutyl decanoate, pentyl decanoate, hexyl decanoate, methyl dodecanoate, ethyl dodecanoate, propyl dodecanoate, isopropyl dodecanoate, butyl dodecanoate, isobutyl dodecanoate, pentyl dodecanoate, hexyl dodecanoate, methyl laurate, ethyl laurate, propyl laurate, isopropyl laurate, butyl laurate, isobutyl laurate, pentyl laurate, hexyl laurate, methyl acrylate, ethyl acrylate, propyl acrylate, isopropyl acrylate, butyl acrylate, isobutyl acrylate, pentyl acrylate, hexyl acrylate, monomethyl oxalate, dimethyl oxalate, monoethyl oxalate, diethyl oxalate, monopropyl oxalate, dipropyl oxalate, monobutyl oxalate, dibutyl oxalate, monomethyl succinate, dimethyl succinate, monoethyl succinate, diethyl succinate, monopropyl succinate, dipropyl succinate, monobutyl succinate, dibutyl succinate, monomethyl adipate, dimethyl adipate, monoethyl adipate, diethyl adipate, monopropyl adipate, dipropyl adipate, monobutyl adipate, dibutyl adipate, monomethyl tartrate, dimethyl tartrate, monoethyl tartrate, diethyl tartrate, monopropyl tartrate, dipropyl tartrate, monobutyl tartrate, dibutyl tartrate, monomethyl citrate, dimethyl citrate, monoethyl citrate, diethyl citrate, monopropyl citrate, dipropyl citrate, monobutyl citrate, dibutyl citrate, dimethyl phthalate, diethyl phthalate, dipropyl phthalate, dibutyl phthalate, dipentyl phthalate, dihexyl phthalate, diheptyl phthalate, dioctyl phthalate, dinonyl phthalate, didecyl phthalate, didodecyl phthalate, dimethyl terephthalate, diethyl terephthalate, dipropyl terephthalate, dibutyl terephthalate, dipentyl terephthalate, dihexyl terephthalate, diheptyl terephthalate, dioctyl terephthalate, dinonyl terephthalate, didecyl terephthalate, didodecyl terephthalate, propylene carbonate, and γ-butyrolactone;

the hydrocarbons are at least one member selected from the group consisting of hexane, cyclohexane, octane, isooctane, benzene, and toluene;

the halogen compounds are at least one member selected from the group consisting of chloroform, o-dichlorobenzene, perfluorohexane, and perfluoromethylcyclohexane;

the fluorinated alcohols are at least one member selected from the group consisting of trifluoroethanol, pentafluoropropanol, and 2,2,3,3-tetrafluoropropanol;

the phosphate esters are at least one member selected from the group consisting of dimethyl phosphate, dibutyl phosphate, diphenyl phosphate, dibenzyl phosphate, trimethyl phosphate, triethyl phosphate, tripropyl phosphate, tributyl phosphate, and triphenyl phosphate; and the nitrogen-containing compounds are at least one member selected from the group consisting of tetramethylurea and N-methyl-2-pyrrolidone.

Item 29: A method of cleaning a via hole, comprising cleaning an object that has a via hole, with at least one member selected from the group consisting of titanium compounds and polymers adhering to at least one member selected from the group consisting of the sidewall and the bottom of the via hole, by the use of the cleaning solution of item 20.

Item 30: A method according to item 29, comprising treating the object while performing ultrasonic cleaning.

Item 31: A cleaned object that can be obtained according to the method of item 29.

Item 32: A method of cleaning a capacitor, comprising cleaning an object that has a metal capacitor upper electrode or lower electrode, with at least one member selected from the group consisting of resist residue, polymers, and titanium compounds adhering to at least one member selected from the group consisting of the sidewall, the bottom, and the surface of the electrode, by the use of the cleaning solution of item 20.

Item 33: A method according to item 32, comprising treating the object while performing ultrasonic cleaning.

Item 34: A cleaned object that can be obtained according to the method of item 32.

Item 35: A resist-removing solution according to item 1, wherein the solution etches, in a treatment time of 0.1 to 120 minutes, (1) an insulating film barrier to a depth of 1 to 200 Å, (2) low-k film to a depth of 1 to 200 Å, and (3) Cu at an etching rate of no more than 5 Å/min; and the solution removes resist, antireflection coating, filling material, and etching residue including these, after dry etching in the formation of damascene and dual damascene structures for Cu/low-k multilevel interconnection.

Item 36: A removing solution according to item 35, wherein the insulating film barrier and the low-k film are Si-containing compounds such as SiN, SiC, SiCN, SiOC, and $SiO_2$.

Item 37: A removing solution according to item 35, wherein the solution removes resist, antireflection coating, filling material, and etching residue including these after etching with a nitrogen-containing gas or an etching gas mixed with nitrogen, regardless of whether plasma ashing is conducted or not.

Item 38: A removing solution according to item 35, wherein the solution removes resist, antireflection coating, filling material, and etching residue including these after ashing with a nitrogen-containing gas or an etching gas mixed with nitrogen.

Item 39: A removing solution according to item 35, wherein one or more inert gases are dissolved in the solution such that the oxygen partial pressure in the solution is below the oxygen partial pressure in air-saturated solution.

Item 40: A removing solution according to item 35, comprising (i) HF, (ii) a protogenic solvent, and (iii) at least one organic compound selected from the group consisting of polar aprotic solvents having a donor number of no more than 24 and neutral solvents; wherein the weight ratio of (i) HF (hydrogen fluoride)/(ii) protogenic solvent/(iii) said at least one organic compound selected from the group consisting of polar aprotic solvents having a donor number of no more than 24 and neutral solvents is in the range of (i) 0.05 to 5 mass %/(ii) 1 to 98.95 mass %/(iii) 1 to 98.95 mass %.

Item 41: A removing solution according to item 35, comprising (i) HF, (ii) a protogenic solvent, and (iii) at least one organic compound selected from the group consisting of polar aprotic solvents having a donor number of no more than 24 and neutral solvents, and further comprising (iv) water; wherein the weight ratio of (i) HF (hydrogen fluoride)/(ii) protogenic solvent/(iii) said at least one organic compound selected from the group consisting of polar aprotic solvents having a donor number of no more than 24 and neutral solvents/(iv) water is in the range of (i) 0.05 to 5 mass %/(ii) 1 to 98.93 mass %/(iii) 1 to 98.93 mass %/(iv) 0.02 to 90 mass %.

Item 42: A removing solution according to item 35, comprising (i) HF, (ii) a protogenic solvent, (iii) at least one organic compound selected from the group consisting of polar aprotic solvents having a donor number of no more than 24 and neutral solvents, and (iv) water, and further comprising at least one member selected from the group consisting of (v) acids, (vi) polar protophilic solvents having a donor number of at least 25, and (vii) fluorine-containing organic compounds; wherein the weight ratio of (i) HF/(ii) protogenic solvent/(iii) said at least one organic compound selected from the group consisting of polar aprotic solvents having a donor number of no more than 24 and neutral solvents/(iv) water/(v) acid/(vi) polar protophilic solvent/(vii) fluorine-containing organic compound is in the range of (i) 0.05 to 5 mass %/(ii) 1 to 98.83 mass %/(iii) 1 to 98.83 mass %/(iv) 0.02 to 90 mass %/(v) 0 to 10 mass %/(vi) 0 to 50 mass %/(vii) 0 to 70 mass % (with the total amount of acid, polar protophilic solvent having a donor number of at least 25, and fluorine-containing organic compound being 0.1 to 74.93 mass %).

Item 43: A removing solution according to item 35, comprising (i) HF, (ii) a protogenic solvent, (iii) at least one organic compound selected from the group consisting of polar aprotic solvents having a donor number of no more than 24 and neutral solvents, (iv) water, and at least one member selected from the group consisting of (v) acids, (vi) polar protophilic solvents having a donor number of at least 25, and (vii) fluorine-containing organic compounds, and further comprising ammonia and/or amine(s); wherein the weight ratio of (i) HF/(ii) protogenic solvent/(iii) said at least one organic compound selected from the group consisting of polar aprotic solvents having a donor number of no more than 24 and neutral solvents/(iv) water/(v) acid/(vi) polar protophilic solvent/(vii) fluorine-containing organic compound/(viii) ammonia and/or amine is in the range of (i) 0.05 to 5 mass %/(ii) 1 to 98.73 mass %/(iii) 1 to 98.73 mass %/(iv) 0.02 to 90 mass %/(v) 0 to 10 mass %/(vi) 0 to 50 mass %/(vii) 0 to 70 mass %/(viii) 0.05 to 10 mass % (with the total amount of acid, polar protophilic solvent having a donor number of at least 25, and fluorine-containing organic compound being 0.1 to 74.83 mass %).

Item 44: A removing solution according to item 35, comprising (i) HF, (ii) at least one organic compound selected from the group consisting of polar aprotic solvents having a donor number of no more than 24, neutral solvents, and protogenic solvents, and (iii) water; wherein the weight ratio of (i) HF (hydrogen fluoride)/(ii) said at least one organic compound selected from the group consisting of polar aprotic solvents having a donor number of no more than 24, neutral solvents, and protogenic solvents/(iii) water is in the range of (i) 0.05 to 5 mass %/(ii) 85 to 99.93 mass %/(iii) 0.02 to 10 mass %.

Item 45: A removing solution according to item 35, comprising (i) HF, (ii) at least one organic compound selected from the group consisting of polar aprotic solvents having a donor number of no more than 24, neutral solvents, and protogenic solvents, and (iii) water, and further comprising at least one member selected from the group consisting of acids, polar protophilic solvents having a donor number of at least 25, and fluorine-containing organic compounds; wherein the weight ratio of (i) HF/(ii) said at least one organic compound selected from the group consisting of polar aprotic solvents having a donor number of no more than 24, neutral solvents, and protogenic solvents/(iii) water/(iv) acid/(v) polar protophilic solvent having a donor number of at least 25/(vi) fluorine-containing organic compound is in the range of (i) 0.05 to 5 mass %/(ii) 25 to 99.83 mass %/(iii) 0.02 to 10 mass %/(iv) 0 to 10 mass %/(v) 0 to 50 mass %/(vi) 0 to 70 mass % (with the total amount of acid, polar protophilic solvent having a donor number of at least 25, and fluorine-containing organic compound being 0.1 to 74.93 mass %).

Item 46: A removing solution according to item 35, comprising (i) HF, (ii) at least one organic compound selected from the group consisting of polar aprotic solvents having a donor number of no more than 24, neutral solvents, and protogenic solvents, (iii) water, and at least one member selected from the group consisting of (iv) acids, (v) polar protophilic solvents having a donor number of at least 25, and (vi) fluorine-containing organic compounds, and further comprising (vii) ammonia and/or amine(s); wherein the weight ratio of (i) HF/(ii) said at least one organic compound selected from the group consisting of polar aprotic solvents having a donor number of no more than 24, neutral solvents, and protogenic solvents/(iii) water/(iv) acid/(v) polar protophilic solvent/(vi) fluorine-containing organic compound/(viii) ammonia and/or amine is in the range of (i) 0.05 to 5 mass %/(ii) 25 to 99.78 mass %/(iii) 0.02 to 10 mass %/(iv) 0 to 10 mass %/(v) 0 to 50 mass %/(vi) 0 to 70 mass %/(vii) 0.05 to 10 mass % (with the total amount of said at least one member selected from the group consisting of acids, polar protophilic solvents having a donor number of at least 25, and fluorine-containing organic compounds being 0.1 to 74.88 mass %).

Item 47: A removing solution according to item 40, wherein the neutral solvents are alcohols; the protogenic solvent is at least one member selected from the group consisting of monocarboxylic acids, polycarboxylic acids, and sulfonic acids; and the polar aprotic solvents having a donor number of no more than 24 are at least one member selected from the group consisting of esters, ethers, ketones, and acid anhydrides.

Item 48: A removing solution according to item 47, wherein (I) as the neutral solvents, the alcohols are methyl alcohol, ethyl alcohol, propanol, isopropanol, t-butanol, allyl alcohol, ethylene glycol, propylene glycol, ethylene glycol monomethyl ether, ethylene glycol monoethyl ether, ethylene glycol monopropyl ether, ethylene glycol monoisopropyl ether, ethylene glycol monobutyl ether, ethylene glycol monoisobutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, triethylene glycol monomethyl ether, triethylene glycol monoethyl ether, triethylene glycol monopropyl ether, triethylene glycol monoisopropyl ether, triethylene glycol monobutyl ether, triethylene glycol monoisobutyl ether, polyethylene glycol monomethyl ether, propylene glycol monomethyl ether, propylene glycol monoethyl ether, propylene glycol monopropyl ether, propylene glycol monoisopropyl ether, propylene glycol monoisobutyl ether, propylene glycol monobutyl ether, dipropylene glycol monomethyl ether, dipropylene glycol monoethyl ether, dipropylene glycol monopropyl ether, dipropylene glycol monoisopropyl ether, tripropylene glycol monomethyl ether, and ethylene glycol monoallyl ether; (II) as the protogenic solvents, the monocarboxylic acids are formic acid, acetic acid, propionic acid, butyric acid, isobutyric acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, methacrylic acid, and acrylic acid; the polycarboxylic acids are oxalic acid, succinic acid, adipic acid, and citric acid; and the sulfonic acids are methanesulfonic acid, benzenesulfonic acid, toluenesulfonic acid, and trifluoromethanesulfonic acid; (III) as the polar aprotic solvents having a donor number of no more than 24, the esters are methyl acetate, ethyl acetate, butyl acetate, propylene carbonate, ethylene carbonate, ethylene sulfite, lactone, tributyl phosphate, and trimethyl phosphate; the ethers are dioxane, trioxane, diglyme, 1,2-dimethoxyethane, tetrahydrofuran, diethyl ether, dimethoxymethane, dimethoxypropane, diethoxymethane, 1,1-dimethoxyethane, ethylene glycol methyl ethyl ether, ethylene glycol diethyl ether, diethylene glycol dimethyl ether, diethylene glycol methyl ethyl ether, diethylene glycol diethyl ether, triethylene glycol dimethyl ether, triethylene glycol ethyl methyl ether, triethylene glycol diethyl ether, tetraethylene glycol dimethyl ether, tetraethylene glycol diethyl ether, polyethylene glycol dimethyl ether, ethylene glycol monomethyl ether acetate, ethylene glycol monoethyl ether acetate, diethylene glycol monomethyl ether acetate, and diethylene glycol monoethyl ether acetate; the ketones are acetone; and the acid anhydrides are acetic anhydride.

Item 49: A removing solution according to item 42, 43, 45, or 46, wherein the acids are at least one member selected from the group consisting of hydrogen chloride, hydrogen bromide, hydrogen iodide, aqueous solutions thereof, sulfuric acid, nitric acid, phosphoric acid, and carboxylic acid.

Item 50: A removing solution according to item 42, 43, 45, or 46, wherein the fluorine-containing organic compounds are fluorine-containing ethers such as CHF2CF2OCH2CF3 and CHF2CF2OCH4; and hydrochlorofluorocarbons (HCFCs) such as CH3CCl2F and CClF2CF2CHClF.

Item 51: A removing solution according to item 42, 43, 45, or 46, wherein the polar protophilic solvents having a donor number of at least 25 are at least one member selected from the group consisting of amides such as dimethylformamide, dimethylacetamide, hexamethylphosphoric triamide, N-methyl-2-pyrrolidone, 1,1,3,3-tetramethylurea, N-methylpropionamide, and dimethyl imidazolidinone; and sulfur compounds such as dimethyl sulfoxide, sulfolane, dimethylthioformamide, and N-methylthiopyrrolidone.

Item 52: A removing solution according to any of items 40 to 46, wherein the solution comprises a carboxylic acid as a protogenic solvent; and at least one member selected from the group consisting of alcohols as neutral solvents, and esters and ethers as polar aprotic solvents having a donor number of no more than 24.

Item 53: A removing solution according to item 52, wherein the carboxylic acid is acetic acid.

Item 54: A removing solution according to item 47, wherein the solution comprises an alcohol as a neutral solvent; and at least one member selected from the group consisting of esters and ethers as polar aprotic solvents having a donor number of no more than 24.

Item 55: A removing solution according to item 47, wherein the alcohols are at least one member selected from the group consisting of propanol, isopropanol, t-butanol, allyl alcohol, ethylene glycol, ethylene glycol monomethyl ether, ethylene glycol monoethyl ether, ethylene glycol monopropyl ether, ethylene glycol monoisopropyl ether, ethylene glycol monobutyl ether, ethylene glycol monoisobutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, triethylene glycol monomethyl ether, triethylene glycol monoethyl ether, triethylene glycol monopropyl ether, triethylene glycol monoisopropyl ether, triethylene glycol monobutyl ether, triethylene glycol monoisobutyl ether, polyethylene glycol monomethyl ether, propylene glycol monomethyl ether, propylene glycol monoethyl ether, propylene glycol monopropyl ether, propylene glycol monoisopropyl ether, propylene glycol monoisobutyl ether, propylene glycol monobutyl ether, dipropylene glycol monomethyl ether, dipropylene glycol monoethyl ether, dipropylene glycol monopropyl ether, dipropylene glycol monoisopropyl ether, tripropylene glycol monomethyl ether, and ethylene glycol monoallyl ether.

Item 56: A removing solution according to any of items 40 to 46, wherein the solution comprises at least one member selected from the group consisting of esters and ethers as polar aprotic solvents having a donor number of no more than 24.

Item 57: A removing solution according to any of items 40 to 46, wherein the esters are at least one member selected from the group consisting of methyl acetate, ethyl acetate, butyl acetate, propylene carbonate, and ethylene carbonate; and the ethers are at least one member selected from the group consisting of 1,2-dimethoxyethane, tetrahydrofuran, dioxane, trioxane, diglyme, ethylene glycol methyl ethyl ether, ethylene glycol diethyl ether, diethylene glycol dimethyl ether, diethylene glycol methyl ethyl ether, diethylene glycol diethyl ether, triethylene glycol dimethyl ether, triethylene glycol ethyl methyl ether, triethylene glycol diethyl ether, tetraethylene glycol dimethyl ether, tetraethylene glycol diethyl ether, polyethylene glycol dimethyl ether, ethylene glycol monomethyl ether acetate, ethylene glycol monoethyl ether acetate, diethylene glycol monomethyl ether acetate, and diethylene glycol monoethyl ether acetate.

Item 58: A removing solution according to item 44, comprising HF, acetic acid, and water; wherein the weight ratio of HF/acetic acid/water is in the range of 0.05 to 5 mass %/85 to 99.93 mass %/0.02 to 10 mass %.

Item 59: A removing solution according to item 44, comprising HF, isopropanol, and water; wherein the weight ratio of HF/isopropanol/water is in the range of 1 to 7 mass %/88 to 98.5 mass %/0.5 to 5 mass %.

Item 60: A removing solution according to item 44, comprising HF, acetic acid, isopropanol, and water; wherein the weight ratio of HF/acetic acid/isopropanol/water is in the range of 0.05 to 6 mass %/1 to 98.93 mass %/1 to 98.93 mass %/0.02 to 12 mass %.

Item 61: A removing solution according to item 44, comprising HF, 1,2-dimethoxyethane, and water; wherein the weight ratio of HF/1,2-dimethoxyethane/water is in the range of 0.50 to 5 mass %/85.00 to 99.3 mass %/0.02 to 10 mass %.

Item 62: A removing solution according to item 44, comprising HF; at least one member selected from the group consisting of methyl acetate, ethyl acetate, and butyl acetate; and water; wherein the weight ratio of HF/said at least one member selected from the group consisting of methyl acetate, ethyl acetate, and butyl acetate/water is in the range of 0.50 to 5 mass %/85.00 to 99.30 mass %/0.02 to 10 mass %.

Item 63: A removing solution according to item 44, comprising HF, 1,4-dioxane, and water; wherein the weight ratio of HF/1,4-dioxane/water is in the range of 0.50 to 5 mass %/85.00 to 99.3 mass %/0.2 to 10 mass %.

Item 64: A removing solution according to item 44, comprising HF; 1,4-dioxane and at least one member selected from the group consisting of acetic anhydride and acetic acid; and water; wherein the weight ratio of HF/1,4-dioxane and said at least one member selected from the group consisting of acetic anhydride and acetic acid/water is in the range of 0.50 to 6 mass %/82.00 to 99.30 mass %/0.2 to 12 mass %.

Item 65: A removing solution according to item 44, comprising HF; at least one member selected from the group consisting of ethylene glycol monomethyl ether, ethylene glycol diethyl ether, diethylene glycol methyl ethyl ether, tetraethylene glycol dimethyl ether, polyethylene glycol dimethyl ether, ethylene glycol monoallyl ether, diethylene glycol monobutyl ether, ethylene glycol butyl ether, triethylene glycol monobutyl ether, diethylene glycol diethyl ether, diethylene glycol dimethyl ether, triethylene glycol dimethyl ether, diethylene glycol monoisobutyl ether, ethylene glycol monoisobutyl ether, ethylene glycol monoisopropyl ether, diethylene glycol monomethyl ether, dipropylene glycol monomethyl ether, propylene glycol monomethyl ether, tripropylene glycol monomethyl ether, ethylene glycol monoethyl ether, polyethylene glycol monomethyl ether, triethylene glycol monomethyl ether, propylene glycol monopropyl ether, and ethylene glycol methyl ethyl ether; and water; wherein the weight ratio of HF/said at least one member selected from the group consisting of ethylene glycol monomethyl ether, ethylene glycol diethyl ether, diethylene glycol methyl ethyl ether, tetraethylene glycol dimethyl ether, polyethylene glycol dimethyl ether, ethylene glycol monoallyl ether, diethylene glycol monobutyl ether, ethylene glycol butyl ether, triethylene glycol monobutyl ether, diethylene glycol diethyl ether, diethylene glycol dimethyl ether, triethylene glycol dimethyl ether, diethylene glycol monoisobutyl ether, ethylene glycol monoisobutyl ether, ethylene glycol monoisopropyl ether, diethylene glycol monomethyl ether, dipropylene glycol monomethyl ether, propylene glycol monomethyl ether, tripropylene glycol monomethyl ether, ethylene glycol monoethyl ether, polyethylene glycol monomethyl ether, triethylene glycol monomethyl ether, propylene glycol monopropyl ether, and ethylene glycol methyl ethyl ether/water is in the range of 0.50 to 5 mass %/85.00 to 99.30 mass %/0.20 to 10 mass %.

Item 66: A removing solution according to item 35, comprising HF, methanesulfonic acid, and water; wherein the weight ratio of HF/methanesulfonic acid/water is in the range of more than 0 and not more than 5 mass %/at least 45 and less than 100 mass %/more than 0 and not more than 50 mass %.

Item 67: A removing method comprising removing etching residue while leaving low-k film that has been damaged by a plasma process, by the use of the removing solution of item 1 or 35.

Item 68: A method according to item 15 or 67, comprising performing a removal treatment under an atmosphere (substantially in inert gas) wherein one or more inert gases are mixed such that the atmosphere has an oxygen partial pressure below the oxygen partial pressure in air.

Item 69: A rinse treatment method for removing a removing solution from an object treated by the method of item 15 or 67, comprising performing a rinse treatment using water wherein one or more inert gases are dissolved such that the oxygen partial pressure in the water is below the oxygen partial pressure in air-saturated solution, under an atmosphere (substantially in inert gas) wherein one or more inert gases are mixed such that the atmosphere has an oxygen partial pressure below the oxygen partial pressure in air.

Item 70: A removal-treated object that can be obtained by treatment according to the removing method of item 67 or 68 and the rinse treatment method of item 69.

Item 71: A cleaning solution for a via hole or a capacitor according to item 20, wherein the removing solution of item 35 is used to clean the via hole or the capacitor.

Item 72: A method of cleaning a via hole according to item 29 or a method of cleaning a capacitor according to item 32, comprising using the cleaning solution for a via hole or a capacitor of item 71.

Item 73: A cleaned object that can be obtained by cleaning treatment using the cleaning solution for a via hole or a capacitor of item 71.

The present invention relates to a resist-removing solution and a resist-removing method for low-k film; a cleaning solution and a cleaning method for via holes; and a cleaning solution and a cleaning method for capacitors.

The removing solution and the cleaning solution of the invention are compositions comprising hydrogen fluoride (HF) and at least one member selected from the group consisting of organic acids and organic solvents.

Examples of organic acids include monocarboxylic acids such as acetic acid, propionic acid, butyric acid, isobutyric acid, valeric acid, caproic acid, caprylic acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, and acrylic acid; sulfonic acids such as methanesulfonic acid and toluenesulfonic acid; and polycarboxylic acids such as oxalic acid, succinic acid, adipic acid, tartaric acid, and citric acid. Among these organic acids, acetic acid is especially preferable.

Examples of organic solvents include:

monohydric alcohols such as methanol, ethanol, isopropanol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonyl alcohol, 1-decanol, 1-dodecanol, lauryl alcohol, and cyclohexanol;

polyols such as ethylene glycol, diethylene glycol, 1,2-propanediol, propylene glycol, 2,3-butanediol, and glycerin;

ketones such as acetone, acetylacetone, methyl ethyl ketone, methyl isobutyl ketone, cyclohexanone, diethyl ketone, and diisobutyl ketone;

amides such as N-methylformamide, N,N-dimethylformamide, N-methylacetamide, and N,N-dimethylacetamide;

nitriles such as acetonitrile, propionitrile, butyronitrile, isobutyronitrile, and benzonitrile;

aldehydes such as formaldehyde, acetaldehyde, and propionaldehyde;

alkylene glycol monoalkyl ethers such as ethylene glycol monomethyl ether and ethylene glycol monoethyl ether;

ethers such as tetrahydrofuran, dioxane, diisopropyl ether, dibutyl ether, tetrahydropyran, anisole, 1,2-dimethoxyethane, and diethylene glycol dimethyl ether;

esters such as methyl acetate, ethyl acetate, propyl acetate, isopropyl acetate, butyl acetate, isobutyl acetate, pentyl acetate, hexyl acetate, methyl propionate, ethyl propionate, propyl propionate, isopropyl propionate, butyl propionate, isobutyl propionate, pentyl propionate, hexyl propionate, methyl butyrate, ethyl butyrate, propyl butyrate, isopropyl butyrate, butyl butyrate, isobutyl butyrate, pentyl butyrate, hexyl butyrate, methyl isobutyrate, ethyl isobutyrate, propyl isobutyrate, isopropyl isobutyrate, butyl isobutyrate, isobutyl isobutyrate, pentyl isobutyrate, hexyl isobutyrate, methyl valerate, ethyl valerate, propyl valerate, isopropyl valerate, butyl valerate, isobutyl valerate, pentyl valerate, hexyl valerate, methyl isovalerate, ethyl isovalerate, propyl isovalerate, isopropyl isovalerate, butyl isovalerate, isobutyl isovalerate, pentyl isovalerate, hexyl isovalerate, methyl caproate, ethyl caproate, propyl caproate, isopropyl caproate, butyl caproate, isobutyl caproate, pentyl caproate, hexyl caproate, methyl caprylate, ethyl caprylate, propyl caprylate, isopropyl caprylate, butyl caprylate, isobutyl caprylate, pentyl caprylate, hexyl caprylate, methyl octanoate, ethyl octanoate, propyl octanoate, isopropyl octanoate, butyl octanoate, isobutyl octanoate, pentyl octanoate, hexyl octanoate, methyl nonanoate, ethyl nonanoate, propyl nonanoate, isopropyl nonanoate, butyl nonanoate, isobutyl nonanoate, pentyl nonanoate, hexyl nonanoate, methyl decanoate, ethyl decanoate, propyl decanoate, isopropyl decanoate, butyl decanoate, isobutyl decanoate, pentyl decanoate, hexyl decanoate, methyl dodecanoate, ethyl dodecanoate, propyl dodecanoate, isopropyl dodecanoate, butyl dodecanoate, isobutyl dodecanoate, pentyl dodecanoate, hexyl dodecanoate, methyl laurate, ethyl laurate, propyl laurate, isopropyl laurate, butyl laurate, isobutyl laurate, pentyl laurate, hexyl laurate, methyl acrylate, ethyl acrylate, propyl acrylate, isopropyl acrylate, butyl acrylate, isobutyl acrylate, pentyl acrylate, hexyl acrylate, monomethyl oxalate, dimethyl oxalate, monoethyl oxalate, diethyl oxalate, monopropyl oxalate, dipropyl oxalate, monobutyl oxalate, dibutyl oxalate, monomethyl succinate, dimethyl succinate, monoethyl succinate, diethyl succinate, monopropyl succinate, dipropyl succinate, monobutyl succinate, dibutyl succinate, monomethyl adipate, dimethyl adipate, monoethyl adipate, diethyl adipate, monopropyl adipate, dipropyl adipate, monobutyl adipate, dibutyl adipate, monomethyl tartrate, dimethyl tartrate, monoethyl tartrate, diethyl tartrate, monopropyl tartrate, dipropyl tartrate, monobutyl tartrate, dibutyl tartrate, monomethyl citrate, dimethyl citrate, monoethyl citrate, diethyl citrate, monopropyl citrate, dipropyl citrate, monobutyl citrate, dibutyl citrate, dimethyl phthalate, diethyl phthalate, dipropyl phthalate, dibutyl phthalate, dipentyl phthalate, dihexyl phthalate, diheptyl phthalate, dioctyl phthalate, dinonyl phthalate, didecyl phthalate, didodecyl phthalate, dimethyl terephthalate, diethyl terephthalate, dipropyl terephthalate, dibutyl terephthalate, dipentyl terephthalate, dihexyl terephthalate, diheptyl terephthalate, dioctyl terephthalate, dinonyl terephthalate, didecyl terephthalate, didodecyl terephthalate, propylene carbonate, and γ-butyrolactone;

hydrocarbons such as hexane, cyclohexane, octane, isooctane, benzene, and toluene;

halogen compounds such as chloroform, o-dichlorobenzene, perfluorohexane, and perfluoromethylcyclohexane;

fluorinated alcohols such as trifluoroethanol (e.g. CF3CH2OH), pentafluoropropanol (e.g. CF3CF2CH2OH), and 2,2,3,3-tetrafluoropropanol;

acetic anhydride, dimethyl sulfoxide, sulfolane, and nitromethane;

nitrogen-containing organic solvents such as tetramethylurea and N-methyl-2-pyrrolidone; and phosphate ester solvents such as dimethyl phosphate, dibutyl phosphate, diphenyl phosphate, dibenzyl phosphate, trimethyl phosphate, triethyl phosphate, tripropyl phosphate, tributyl phosphate, and triphenyl phosphate.

Among these organic solvents, preferable examples are isopropanol (IPA), 1-propanol, 1-butanol, 2-butanol, t-butanol, 2-methyl-1-propanol, 1-pentanol, 1-hexanol, ethylene glycol, diethylene glycol, 1,2-propanediol, cyclohexanol, propylene glycol, glycerin, dibutyl ether, N-methylformamide, N,N-dimethylformamide, N-methylacetamide, N,N-dimethylacetamide, N-methyl-2-pyrrolidone, tetrahydrofuran, dioxane, methyl acetate, ethyl acetate, propyl acetate, isopropyl acetate, butyl acetate, isobutyl acetate, pentyl acetate, hexyl acetate, dimethyl sulfoxide, sulfolane, octane, cyclohexane, benzene, and toluene. Especially preferable organic solvents are IPA, hexanol, cyclohexanol, lauryl alcohol, propylene glycol, diethylene glycol, ethylene glycol, glycerin, dibutyl ether, butyl acetate, octane, cyclohexane, benzene, and toluene. Methanol and ethanol can be additionally used in an amount that does not corrode wiring materials such as Cu.

When the removing solution of the present invention is used for ultrasonic cleaning, the organic solvent is preferably at least one member selected from the group consisting of esters, ketones, monohydric alcohols, polyhydric alcohols, amides, ethers, alkylene glycol monoalkyl ethers, phosphate esters, and nitrogen-containing compounds.

In view of properties for removing resist or cleaning via holes and contact holes, organic acids or organic solvents preferably have an SP value of about 7 to about 17, more preferably about 8 to about 17, and even more preferably about 9 to about 17.

In the removing solution and the cleaning solution of the invention, the amount of HF is not limited and can be suitably set according to the kind of other components. When the removing solution/cleaning solution contains organic acid(s) (i.e. when it contains organic acid(s) but no organic solvent, or when it contains organic acid(s) and organic solvent(s)), the amount of HF is about 0.01 to about 5 mass %, preferably about 0.05 to about 3 mass %, and more preferably about 0.1 to about 1 mass %, based on the total amount of the removing solution/cleaning solution (hereinafter, the amount of each component is indicated based on the total amount of the removing solution/cleaning solution). When the solution does not contain any organic acid (i.e. when it contains organic solvent(s) but no organic acid), the amount of HF is about 0.01 to about 10 mass %, preferably about 0.05 to about 5 mass %, and more preferably about 0.1 to about 3 mass %.

When the removing solution/cleaning solution contains water, the amount of water is no more than about 70 mass %, preferably no more than about 50 mass %, and more preferably no more than about 5 mass %.

The amount of said at least one member selected from the group consisting of organic acids and organic solvents is about 30 to about 99.99 mass %, preferably about 50 to about 99.9 mass %, more preferably about 90 to about 99.9 mass %, and even more preferably about 95 to about 99.9 mass %.

Usually HF is used in the form of dilute hydrofluoric acid (50 mass % aqueous solution); however, without water, 100% HF may be used.

Preferable examples of removing solutions, cleaning solutions, and amounts of components in the present invention are given below.

In this specification, the amount of "HF" means the amount of anhydrous HF unless otherwise indicated.

HF/organic acid/water=0.01-5 mass %/49-99.9 mass %/0-50 mass %

HF/organic solvent/water=0.01-10 mass %/49-99.9 mass %/0-50 mass %

The following are more preferable examples of removing solutions, cleaning solutions, and amounts of components in the invention.

HF/acetic acid/water=0.05-5 mass %/90-99.95 mass %/0-5 mass %
HF/IPA/water=0.1-10 mass %/80-99.9 mass %/0-10 mass %
HF/hexanol/water=0.1-10 mass %/80-99.9 mass %/0-10 mass %
HF/lauryl alcohol/water=0.1-10 mass %/80-99.9 mass %/0-10 mass %
HF/propylene glycol/water=0.1-10 mass %/80-99.9 mass %/0-10 mass %
HF/diethylene glycol/water=0.1-10 mass %/80-99.9 mass %/0-10 mass %
HF/ethylene glycol/water=0.1-10 mass %/80-99.9 mass %/0-10 mass %
HF/glycerin/water=0.1-10 mass %/80-99.9 mass %/0-10 mass %
HF/cyclohexanol/water=0.1-10 mass %/80-99.9 mass %/0-10 mass %
HF/dibutyl ether/water=0.1-10 mass %/80-99.9 mass %/0-10 mass %
HF/butyl acetate/water=0.1-10 mass %/80-99.9 mass %/0-10 mass %
HF/octane/water=0.1-10 mass %/80-99.9 mass %/0-10 mass %
HF/cyclohexane/water=0.1-10 mass %/80-99.9 mass %/0-10 mass %

HF/benzene/water=0.1-10 mass %/80-99.9 mass %/0-10 mass % HF/toluene/water=0.1-10 mass %/80-99.9 mass %/0-10 mass %

The following are even more preferable examples of removing solutions, cleaning solutions, and amounts of components in the invention.

HF/acetic acid/water=0.1-3 mass %/94-99.99 mass %/0-3 mass %
HF/IPA/water=0.1-5 mass %/90-99.9 mass %/0-5 mass %
HF/hexanol/water=0.1-5 mass %/90-99.9 mass %/0-5 mass %
HF/lauryl alcohol/water=0.1-5 mass %/90-99.9 mass %/0-5 mass %
HF/propylene glycol/water=0.1-5 mass %/90-99.9 mass %/0-5 mass %
HF/diethylene glycol/water=0.1-5 mass %/90-99.9 mass %/0-5 mass %
HF/ethylene glycol/water=0.1-5 mass %/90-99.9 mass %/0-5 mass %
HF/glycerin/water=0.1-5 mass %/90-99.9 mass %/0-5 mass %
HF/cyclohexanol/water=0.1-5 mass %/90-99.9 mass %/0-5 mass %
HF/dibutyl ether/water=0.1-5 mass %/90-99.9 mass %/0-5 mass %
HF/butyl acetate/water=0.1-5 mass %/90-99.9 mass %/0-5 mass %
HF/octane/water=0.1-5 mass %/90-99.9 mass %/0-5 mass %
HF/cyclohexane/water=0.1-5 mass %/90-99.9 mass %/0-5 mass %
HF/benzene/water=0.1-5 mass %/90-99.9 mass %/O-5 mass %
HF/toluene/water=0.1-5 mass %/90-99.9 mass %/0-5 mass %

The removing solution and the cleaning solution of the present invention can be used for ultrasonic cleaning. When the solution is used for this purpose, it is desirable that the solution contain at least one member selected from the group consisting of ammonia and amines.

Examples of amines are hydroxylamines; alkanolamines; primary, secondary, and tertiary amines represented by $NR_3$; alicyclic amines; heterocyclic amines; etc.

Specifically, examples of hydroxylamines include hydroxylamine and N,N-diethylhydroxylamine.

Examples of alkanolamines include monoethanolamine, diethanolamine, and triethanolamine.

In $NR_3$, the three Rs may be the same or different and each individually represents a hydrogen atom or a hydrocarbon group optionally substituted with fluorine, provided that the three Rs are not all hydrogen atoms.

Examples of hydrocarbon groups optionally substituted with fluorine include linear and branched $C_1$ to $C_{18}$, preferably $C_1$ to $C_{12}$, alkyl groups; and phenyl groups optionally substituted with fluorine. Among such examples, unsubstituted $C_1$ to $C_{18}$ alkyl groups are preferable.

The compounds represented by $NR_3$ are, for example, aliphatic amines, including primary amines such as methylamine and ethylamine, secondary amines such as dimethylamine and diethylamine, and tertiary amines such as trimethylamine and triethylamine. Examples of aromatic amines are aniline and methylaniline.

Examples of alicyclic amines are cyclohexylamine and dicyclohexylamine; and examples of heterocyclic amines are pyrrole, pyrrolidine, pyrrolidone, pyridine, morpholine, pyrazine, piperidine, N-hydroxyethylpiperidine, oxazole, and thiazole.

When ammonia and/or amines are present, mixing of the solution forms salts with the ratio of hydrofluoric acid to ammonia/amine being either 1 to 1 or 1 to 2. In the removing solution/cleaning solution of the present invention, hydrofluoric acid, and ammonia and/or amines may be present as salts.

When the solution contains ammonia and/or amines, the molar ratio of ammonia and amines is preferably lower than that of hydrofluoric acid. For example, in the removing solution/cleaning solution that contains these two kinds of components, the molar ratio of hydrofluoric acid/ammonia and amines is about 1/0.01 to 1/1.

When the removing solution/cleaning solution contains an amine, a preferable example of the solution and its components is as follows:

HF/ammonia and/or amines/organic solvent/water=0.01-10 mass %/0.01-30 mass %/49-99.9 mass %/0-50 mass %

The removing solution and the cleaning solution of the present invention may contain at least one surfactant selected from the group consisting of anionic surfactants, cationic surfactants, and nonionic surfactants. Although the amount of surfactant is not limited as long as the effects of the present invention can be achieved, it is usually about 0.0001 to about 10 mass %, preferably about 0.001 to about 5 mass %, and especially preferably about 0.01 to about 1 mass %.

The resist-removing solution of the invention is preferably a composition that can etch a SiN film to a depth of at least 1 Å. The cleaning solution of the invention is preferably a composition that can etch a TiN film to a depth of at least 0.01 Å.

The removing solution of the invention can be advantageously used for resists (including negative and positive resists) used in the etching of low-k films and modified resists.

The resists removed by the method of the present invention are those known resists, such as KrF (Krypton F), ArF, and $F_2$ resists, that have been subjected to an etching treatment with an etching gas such as C4F8.

In this specification, "resist" includes modified resist, which has all or part of the resist surface modified by the etching process. The resist-removing solution of the present invention can remove such modified resist.

When the polymer produced by the polymerization of etching gas in the etching process is present in a trench or a hole formed by etching, the polymer may be removed at the same time as resist.

In this specification, low-k film is a film that can be damaged by $O_2$ plasma ashing. Specifically, it is an insulating film having a dielectric constant greater than 1 but not greater than about 4, preferably not greater than about 3, more preferably not greater than about 2.8, and even more preferably not greater than about 2.6. Examples of low-k film include "Black Diamond" (trade name, product of Applied Materials, Inc.), "CORAL" (trade name, product of Novellus Systems, Inc.), "LKD" series (trade name, product of JSR Corporation), "Aurora" (trade name, product of ASM), "HSG" series (trade name, product of Hitachi Chemical Co., Ltd.), "Nanoglass" (trade name, product of Honewell), "IPS" (trade name, product of Catalysts & Chemicals Industries Co., Ltd.), "$Z_3M$" (trade name, product of Dow Corning Corporation), "XLK" (trade name, product of Dow Corning Corporation), and "FOx" (trade name, product of Dow Corning Corporation).

Examples of the above-mentioned resist include KrF (Krypton F), ArF, and $F_2$ resists; however, the resist is not limited to these.

In the method of the present invention, for example, after forming a low-k film on a semiconductor substrate (such as SiN, copper, TaN, and SiC), forming resist, followed by photolithography for forming patterns, and etching the low-k film according to the patterns, the resist (including modified resist) can be removed by bringing it into contact with the removing solution of the present invention. The removing solution of the invention is a liquid used to treat an object having resist (including modified resist) adhering to a hole or a trench formed in the low-k film and resist, and thereby to remove the resist (and the modified resist). The object may have polymers (polymerization products of etching gas) adhering to the sidewall and/or the bottom of a hole formed in the low-k film by etching.

After forming a low-k film on a substrate, films such as SiN, SiC, and TaN films may be formed on the low-k film and etched together with the low-k film, if necessary.

An antireflection coating may be formed on the resist and then removed together with the resist.

Low-k film and resist usually have a thickness of about 0.01 to about 2 μm, and about 0.01 to about 10 μm, respectively. Optional SiN film, SiC film, TaN film, and antireflection coatings usually have a thickness of about 0.01 to about 2 μm, about 0.001 to about 0.2 μm, about 0.01 to about 10 μm, and about 0.01 to about 0.1 μm, respectively.

In the method of the present invention, if necessary, light $O_2$ plasma ashing (for example, $O_2$ plasma ashing such that the change in dielectric constant before and after the ashing is preferably no more than about 20%, more preferably no more than about 10%, and even more preferably no more than about 5%) or light $H_2$ plasma ashing may be performed between etching and contact with the removing solution of the invention, to an extent such that the low-k film is not damaged.

When light $O_2$ plasma ashing or light $H_2$ plasma ashing is performed as pretreatment, even if the same removing solution is used, the optimum conditions with respect to temperature, time, etc. may differ from those when resist is removed without such ashing after etching.

The method of removing resist using the removing solution of the present invention enables the removal of resist (including modified resist) under temperature and time conditions such that low-k film is substantially undamaged. "Low-k film is substantially undamaged" means, for example, that the change in the physical properties of the low-k film before and after the treatment using the removing solution is such that the performance of the film when used in a semiconductor substrate is not affected; that the low-k film is substantially unetched at the interface between the resist and the film, so that the cross-sectional profile of a treated object with film layers is substantially unchanged; and/or that the dielectric constant of the low-k film is substantially unchanged before and after the treatment using the removing solution. "Low-k film is substantially unetched" means that the low-k film is etched to a depth of preferably no more than about 200 nm, more preferably no more than about 100 nm, and even more preferably no more than about 50 nm. "Dielectric constant of the low-k film is substantially unchanged before and after the treatment using the removing solution" means that the change in the dielectric constant is preferably no more than about 20%, more preferably no more than about 10%, and even more preferably no more than about 5%.

Treatment with the removing solution can be conducted by, for example, after etching, immersing a substrate in the removing solution of the present invention. The immersion conditions are not limited as long as they can remove resist and substantially do not damage low-k film; they can be suitably set according to the temperature and kind of removing solution. For example, when the temperature of a removing solution is about 15° C. to about 60° C., the immersion time may be about 0.1 to about 30 minutes, and preferably about 0.5 to about 20 minutes. More specifically, when the removing solution is composed of HF/acetic acid/water=0.05-1 mass %/98-99.5 mass %/0-1 mass %, and its temperature is about 23° C., immersion time may be about 0.1 to about 20 minutes. When the removing solution is composed of HF/ethylamine/ethylene glycol/water=0.05-2 mass %/0.01-2 mass %/94-99.5 mass %/0-2 mass %, the immersion time may be about 0.1 to about 20 minutes.

Furthermore, since resist can be removed if the removing solution is brought into contact with an object to be treated, the solution, for example, may be supplied from above an object that is rotated while being cleaned; or the solution may be sprayed over an object for cleaning.

When resist cannot be easily removed due to conditions such as the kind of resist and etching, the treatment with the removing solution of the invention may be conducted by, for example, immersing the object to be treated in the solution and performing ultrasonic cleaning.

The conditions for ultrasonic cleaning are not limited as long as they can remove resist. When the temperature of a removing solution is about 23° C., ultrasonic cleaning is usually carried out at 20 to 1200 kHz and 50 to 3000 W for about 0.1 to about 20 minutes.

More specifically, when the removing solution is composed of HF/acetic acid/water=0.05-1 mass %/98-99.5 mass %/0-1 mass %, and its temperature is about 23° C., ultrasonic cleaning may be carried out at 20 to 1200 kHz and 50 to 3000 W for about 0.1 to about 20 minutes. When the removing solution is composed of HF/ethylamine/ethylene glycol/water=0.05-2 mass %/0.05-2 mass %/94-99.5 mass %/0-2 mass %, ultrasonic cleaning may be carried out at 20 to 1200 kHz and 50 to 3000 W for about 0.1 to about 20 minutes.

The semiconductor substrate from which resist has been removed using the removing solution of the invention may be, for example, provided with copper or aluminum wiring. It can be used to produce various semiconductor devices according to conventional methods (such as those mentioned in Toshiroh Doi, ed., *Shousetsu Handoutai CMP Gijutsu* (2001)).

The cleaning solution of the present invention is capable of removing titanium compounds (such as titanium fluorides and titanium oxides) and/or polymers generated by dry etching. The cleaning solution of the invention, therefore, can be used as a via hole cleaning solution, for example, to remove titanium fluorides, polymers, or the like remaining on the sidewalls and/or the bottoms of via holes, etc. after dry etching treatment in semiconductor production processes. The cleaning solution of the invention can be used, for example, to clean via holes, etc. by removing titanium compounds and/or polymers (such as titanium fluorides and titanium oxides) generated in the formation of via holes, etc. The cleaning solution of the invention is capable of cleaning via holes at low temperature and in a short time.

Furthermore, the removing solution of the invention is capable of removing resist residue, titanium compounds, polymers, etc. generated by dry etching. The removing solution of the invention, therefore, can be used as a capacitor cleaning solution in semiconductor production processes, for example, to remove resist residue, polymers, and titanium compounds remaining after the dry etching (and ashing) of an upper or lower electrode metal film (TiN, Ti, etc.) of a metal capacitor. The cleaning solution of the invention can be used, for example, to clean via holes, etc., by removing at least one member selected from the group consisting of resist residue, titanium compounds, and polymers that are generated in the formation of the metal capacitor, etc., and that adhere to at least one member selected from the group consisting of the sidewall, the bottom, and the surface of an upper or lower electrode.

Titanium compounds are generated when the etching process of semiconductor production uses a fluorine-containing gas (such as $C_4F_8$, etc.) as a dry etching gas, and a titanium-containing substrate (such as TiN, etc.). In the present invention, a "polymer" means a polymerization product of an etching gas in etching. Furthermore, in the present invention, "resist residue" means residue generated in ashing after an etching process.

The treatment using the cleaning solution of the present invention can be conducted by immersing an object to be treated in the solution (the object being a semiconductor substrate having at least one member selected from the group consisting of a via hole and a metal capacitor upper or lower electrode, wherein polymers and/or titanium compounds adhere to the sidewall and/or the bottom of the via hole or wherein resist residue and/or polymers and/or titanium compounds adhere to the upper or lower electrode metal film (TiN, Ti, etc.) of the metal capacitor). The immersion conditions can be suitably set according to the kind of cleaning solution. For example, immersion may be carried out under the conditions of about 15° C. to about 60° C., and preferably about room temperature, for about 0.1 to about 20 minutes. In this case, since cleaning can be conducted if the cleaning solution is brought into contact with an object to be treated, the solution, for example, may be supplied from above an object that is rotated while being cleaned; or the solution may be sprayed over an object.

When a polymer that is difficult to remove arises due to the etching conditions, etc., the treatment with the cleaning solution of the present invention may be conducted by, for example, immersing the object to be treated in the solution and performing ultrasonic cleaning. The conditions for ultrasonic cleaning are not limited. For example, when the temperature of the removing solution is about 15° C. to about 60° C., ultrasonic cleaning may be carried out at 20 to 1200 kHz and 50 to 3000 W for about 0.1 to about 30 minutes.

More specifically, when the removing solution is composed of HF/acetic acid/water=0.05-1 mass %/98-99.5 mass %/0-1 mass %, and its temperature is about 23° C., ultrasonic cleaning may be carried out at 20 to 1200 kHz and 50 to 3000 W for about 0.5 to about 20 minutes. When the removing solution is composed of HF/amine or ammonia/ethylene glycol/water=0.05-2 mass %/0.05-2 mass %/94-99.5 mass %/0-2 mass %, ultrasonic cleaning may be carried out at 20 to 1200 kHz and 50 to 3000 W for about 0.5 to about 20 minutes.

A semiconductor substrate wherein via holes and capacitors have been cleaned using the composition of the invention can be adopted to produce various semiconductor devices according to conventional methods (W. Maly, *Atlas of IC Technologies: An Introduction to VLSI Processes* (1987), The Benjamin/Cummings Publishing Company Inc.).

Furthermore, in the present invention, a composition comprising as essential components, hydrogen fluoride (HF); and, among organic acids and organic solvents, at least one member selected from the group consisting of polar aprotic solvents having a donor number of no more than 24, neutral solvents, and protogenic solvents is especially effective for removing resist for low-k film, antireflection coatings, filling materials, and etching residues including these, and for cleaning via holes and capacitors.

In the treatment for removing etching residues including resist, etc., after dry etching, the removing solution of the invention is a composition for removing the etching residues under the conditions of (1) etching an insulating film barrier to a depth of 1 to 200 Å, (2) etching low-k film to a depth of 1 to 200 Å, and (3) etching Cu at an etching rate of no more than 5 Å/min. Using this composition, the removal treatment time is 0.1 to 120 minutes, and particularly 1 to 60 minutes. The etching depth of the insulating film barrier and the low-k film can be controlled within the above range by the treatment time.

There are two kinds of insulating film barriers: those in which etching continues, and those in which etching tends to stop with the passage of time. Films in which etching continues are, for example, SiN, SiO2, and SiOC. Films in which etching tends to stop are, for example, SiC and SiCN.

When an insulating film barrier such as SiC and SiCN, in which etching tends to stop, is etched to a depth of 5 Å, the etching depth of low-k film is 5 to 190 Å, and that of Cu is 0.02 to 2 Å.

When an insulating film barrier such as SiN, SiO2, and SiOC, in which etching continues, is etched to a depth of 50 Å, the etching depth of low-k film is 35 to 195 Å, and that of Cu is 0.02 to 2 Å.

An insulating film barrier is an insulating film used in the production of a Cu/low-k multilevel interconnection structure for wiring in a semiconductor device, (1) to provide a hard mask for low-k film patterning, (2) to provide a barrier for preventing the diffusion of copper, (3) to provide an etch stopper to prevent the etching of low-k film, (4) to protect low-k film and improve its adhesion to a base (a lower layer film), and (5) to protect low-k film in a copper CMP process (as a cap film), etc. In order to maintain these functions and not to damage the dielectric constant of the low-k film, it is desired that the insulating film has a low dielectric constant. Examples of insulating film barriers include silicon (Si)-containing compounds such as silicon nitride (SiN), silicon carbide (SiC), and silicon carbide nitride (SiCN).

In addition to the low-k film already described, low-k film may also be a newly formed film having a dielectric constant not greater than 2.4, such as "Orion" (trade name, product of Tricon). Low-k film is mainly formed by coating or by organic plasma CVD. Low-k film formed by coating is named after its material, and the low-k film formed by organic plasma CVD is named after its material and device. "Orion" is a film formed by organic plasma CVD.

The removing solution of the present invention comprises hydrogen fluoride and at least one member selected from the group consisting of polar aprotic solvents having a donor number of no more than 24, neutral solvents, and protogenic solvents. This removing solution is capable of controlling the etching of wiring metals such as copper; insulating film barriers and low-k film; and resist, antireflection coatings, filling materials, and etching residues including these. Specifically, the removing solution of the invention has the following features: (1) it inhibits the corrosion of metals such as copper; (2) it selectively etches insulating film barriers to separate etching residue from the insulating film barriers or low-k film; (3) it selectively dissolves silicon nitride (SiN), etc., contained in etching residue; and (4) with an organic solvent, it dissolves organic components in resist, antireflection coatings, and etching residues including these, thus removing resist, antireflection coatings, filling materials, and etching residues including these. Etching residues include auxiliary materials such as resist, antireflection coatings, and filling materials, which are used in the production of semiconductor devices; adhered or deposited substances such as reaction products and sputtering products in the processes of dry etching and of ashing after dry etching; and other residues that need to be removed.

Adhered or deposited substances are formed of substances such as fluorocarbon-containing polymers that are generated from the etching gas plasma itself; reaction products that are generated when device materials such as resist, antireflection coatings, filling materials, insulating film barriers, low-k film, wiring metals, etc., are exposed to plasma in the etching process; substances that are generated in the process of sputtering by plasma ions; etc.

Residues that need to be removed are composed of resist including resist modified by etching and ashing, antireflection coating, filling material, etc., which have to be removed and are not needed in processes subsequent to etching. The treatment time for removal and cleaning is 0.1 to 120 minutes, using the removing solution of the invention. The treatment time generally varies according to treatment method, and is determined by the effects of equipment and treatment solution. For example, with single-wafer processing equipment, it is no more than 10 minutes, and with batch processing equipment, it is no more than 60 minutes. The removing solution of the present invention can be used with a wide range of treatment times from 0.1 to 120 minutes.

If the etching amount of an insulating film barrier and low-k film is small, it becomes difficult to remove etching residue. If the etching amount thereof is large, the resulting pattern becomes larger than it is designed to be, thus causing problems. The ratio of the etching amount of the insulating film barrier to that of the low-k film is preferably at least 0.3, and is more preferably at least 1.0. If the etching amount ratio is low, the low-k film is more deeply etched than the insulating film barrier, causing differences in level at the interface between the insulating film barrier and the low-k film. When embedding a barrier metal or embedding wiring copper, the differences in level conceal the low-k film behind the insulating film barrier, causing imperfect embedding.

When a nitrogen-containing gas or an etching gas mixed with nitrogen is used as the etching gas for dry etching silicon (Si)-containing low-k film, the silicon in the low-k film and nitrogen react together to form a compound having a Si—N bond which is similar to silicon nitride (SiN) in composition, giving an etching residue containing this compound. Similarly, when a nitrogen-containing gas is used for the ashing of etching residue, silicon in the low-k film and nitrogen react together to form a compound having a Si—N bond which is similar to silicon nitride (SiN) in composition. The hydrogen fluoride-containing removing solution according to the present invention can remove etching residue having this Si—N bond selectively and effectively. Moreover, the removing solution can also selectively remove etching residue remaining after the ashing process in which a plasma treatment is conducted to remove part of the residue after etching by ashing, reaction, etc. Plasmas such as oxygen, hydrogen, nitrogen, helium, argon, neon, krypton, xenon, and other noble gases; water; and alcohols are used in such plasma treatments.

The organic acid or organic solvent in the invention is at least one member selected from the group consisting of polar aprotic solvents having a donor number of no more than 24, neutral solvents, and protogenic solvents. Neutral solvents and protogenic solvents are classified as amphiprotic solvents, while polar aprotic solvents having a donor number of no more than 24 are generally classified as aprotic solvents. Aprotic solvents that have a comparatively high dipole moment and dielectric constant are referred to as polar aprotic solvents, and other aprotic solvents which have a very low dipole moment and dielectric constant and have very low acidity and basicity are referred to as inert solvents. Polar aprotic solvents can be further classified into polar protophilic solvents and polar protophobic solvents. Polar protophilic solvents have higher basicity than water, and polar protophobic solvents have lower basicity than water.

Preferable neutral solvents are alcohols; preferable protogenic solvents are monocarboxylic acids, polycarboxylic acids, and sulfonic acids; and preferable polar aprotic solvents having a donor number of no more than 24 are esters, ethers, ketones, and acid anhydrides.

(I) As neutral solvents, (1) the alcohols are at least one member selected from the group consisting of methyl alcohol, ethyl alcohol, propanol, isopropanol, t-butanol, allyl alcohol, ethylene glycol, propylene glycol, ethylene glycol monomethyl ether, ethylene glycol monoethyl ether, ethylene glycol monopropyl ether, ethylene glycol monoisopropyl ether, ethylene glycol monobutyl ether, ethylene glycol monoisobutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, triethylene glycol monomethyl ether, triethylene glycol monoethyl ether, triethylene glycol monopropyl ether, triethylene glycol monoisopropyl ether, triethylene glycol monobutyl ether, triethylene glycol monoisobutyl ether, polyethylene glycol monomethyl ether, propylene glycol monomethyl ether, propylene glycol monoethyl ether, propylene glycol monopropyl ether, propylene glycol monoisopropyl ether, propylene glycol monoisobutyl ether, propylene glycol monobutyl ether, dipropylene glycol monomethyl ether, dipropylene glycol monoethyl ether, dipropylene glycol monopropyl ether, dipropylene glycol monoisopropyl ether, tripropylene glycol monomethyl ether, and ethylene glycol monoallyl ether (methyl alcohol and ethyl alcohol not being used singly, but being used in combination with other solvent(s)).

(II) As protogenic solvents, (1) the monocarboxylic acids are at least one member selected from the group consisting of formic acid, acetic acid, propionic acid, butyric acid, isobutyric acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, methacrylic acid, and acrylic acid; (2) the polycarboxylic acids are at least one member selected from the group consisting of oxalic acid, succinic acid, adipic acid, and citric acid; and (3) the sulfonic acids are at least one member selected from the group consisting of methanesulfonic acid, benzenesulfonic acid, toluenesulfonic acid, and trifluoromethanesulfonic acid;

(III) As polar aprotic solvents having a donor number of no more than 24, (1) the esters are at least one member selected from the group consisting of methyl acetate, ethyl acetate, butyl acetate, propylene carbonate, ethylene carbonate, ethylene sulfite, lactone, tributyl phosphate, and trimethyl phosphate; (2) the ethers are at least one member selected from the group consisting of dioxane, trioxane, diglyme, 1,2-dimethoxyethane, tetrahydrofuran, diethyl ether, dimethoxymethane, dimethoxypropane, diethoxymethane, 1,1-dimethoxyethane, ethylene glycol methyl ethyl ether, ethylene glycol diethyl ether, diethylene glycol dimethyl ether, diethylene glycol methyl ethyl ether, diethylene glycol diethyl ether, triethylene glycol dimethyl ether, triethylene glycol ethyl methyl ether, triethylene glycol diethyl ether, tetraethylene glycol dimethyl ether, tetraethylene glycol diethyl ether, polyethylene glycol dimethyl ether, ethylene glycol monomethyl ether acetate, ethylene glycol monoethyl ether acetate, diethylene glycol monomethyl ether acetate, and diethylene glycol monoethyl ether acetate; (3) the ketones are acetone; and (4) the acid anhydrides are acetic anhydride.

When large amounts of organic substances are present in etching residues including resist, antireflection coatings, and filling materials, a solvent with which the organic components can be easily dissolved is preferable. Of the alcohols, for example, ethanol is more preferable than methanol, and isopropanol is even more preferable than ethanol.

Of the polar aprotic solvents having a donor number of no more than 24, neutral solvents, and protogenic solvents, preferable are carboxylic acids, alcohols, esters, and ethers. Further, of these, an especially preferable monocarboxylic acid is acetic acid; especially preferable alcohols are isopropanol (IPA), 1-propanol, t-butanol, allyl alcohol, ethylene glycol, ethylene glycol monomethyl ether, ethylene glycol monoethyl ether, ethylene glycol monopropyl ether, ethylene glycol monoisopropyl ether, ethylene glycol monobutyl ether, ethylene glycol monoisobutyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, triethylene glycol monomethyl ether, triethylene glycol monoethyl ether, triethylene glycol monopropyl ether, triethylene glycol monoisopropyl ether, triethylene glycol monobutyl ether, triethylene glycol monoisobutyl ether, polyethylene glycol monomethyl ether, propylene glycol monomethyl ether, propylene glycol monoethyl ether, propylene glycol monopropyl ether, propylene glycol monoisopropyl ether, propylene glycol monoisobutyl ether, propylene glycol monobutyl ether, dipropylene glycol monomethyl ether, dipropylene glycol monoethyl ether, dipropylene glycol monopropyl ether, dipropylene glycol monoisopropyl ether, tripropylene glycol monomethyl ether, and ethylene glycol monoallyl ether; especially preferable esters are methyl acetate, ethyl acetate, butyl acetate, propylene carbonate, ethylene carbonate; and especially preferable ethers are 1,2-dimethoxyethane, tetrahydrofuran, dioxane, trioxane, diglyme, ethylene glycol methyl ethyl ether, ethylene glycol diethyl ether, diethylene glycol dimethyl ether, diethylene glycol methyl ethyl ether, diethylene glycol diethyl ether, triethylene glycol dimethyl ether, triethylene glycol ethyl methyl ether, triethylene glycol diethyl ether, tetraethylene glycol dimethyl ether, tetraethylene glycol diethyl ether, polyethylene glycol dimethyl ether, ethylene glycol monomethyl ether acetate, ethylene glycol monoethyl ether acetate, diethylene glycol monomethyl ether acetate, and diethylene glycol monoethyl ether acetate.

In the removing solution comprising HF, an organic solvent and/or an organic acid, and water, organic solvents that are effective for selectively etching an insulating film barrier, separating etching residue from an insulating film barrier or low-k film, and dissolving silicon nitride (SiN), etc. contained in the etching residue, are neutral solvents and protogenic solvents, which are amphiprotic solvents; and polar aprotic solvents having a donor number of no more than 24, which are aprotic solvents. Among neutral solvents and protogenic solvents, those having a large acceptor number are more effective for this purpose. Among polar aprotic solvents, those having a smaller donor number are more effective. Moreover, when the concentration of HF is increased, such effects can be enhanced.

The corrosion of copper, which is a wiring material, is reduced when using an amphiprotic solvent that has a large autoprotolysis constant and a large donor number, and when using an aprotic solvent that has a small donor number. Solvents that have a large donor number and a large autoprotolysis constant are, for example, alcohols such as isopropanol (IPA), 1-propanol, and t-butanol. Aprotic solvents that have a small donor number are polar aprotic solvents having a donor number of no more than 24, such as esters, ethers, ketones, and acid anhydrides. In contrast, when an amphiprotic solvent that has a small autoprotolysis constant and a small donor number is used or when a polar protophilic solvent having a donor number of at least 24 is used, copper is readily corroded. Amphiprotic solvents that have a small autoprotolysis constant and a small donor number are, for example, alcohols such as methanol and ethanol. Polar protophilic solvents having a donor number of at least 24 are, for example, amides such as dimethylformamide, and sulfur-containing compounds such as dimethyl sulfoxide.

The amount of copper corrosion is also related to the speed of removing a native copper oxide film. When the removal of a native copper oxide film is fast, the oxide film as a protective film is diminished, so that the amount of copper corrosion is increased. Native copper oxide films have to be removed at some stage in the production of semiconductor devices. It is desirable to remove the native copper oxide films at the same time as resist, antireflection coatings, filling materials, and etching residue, using a removing solution. There is correlation between the above-mentioned copper corrosivity and the removal of native copper oxide film. A solvent that readily corrodes copper easily removes a native oxide film. Therefore, by adding a solvent that readily corrodes copper to one that does not, the removal of a native oxide film can be completed within the time for removal treatment. The speed of removing native copper oxide film can be controlled by, for example, adding an appropriate amount of methanol to isopropanol. By adjusting the amount of solvent to remove all of the native copper oxide film within the time for removal treatment, the removing solution can remove the native copper oxide film while removing resist, antireflection coatings, filling materials, and etching residue.

Autoprotolysis is a reaction in which proton transfer occurs between amphiprotic solvents, such as neutral solvents and protogenic solvents. These solvents have a low autoprotolysis constant $pK_{SH}$.

Autoprotolysis: $SH+SH \Longleftrightarrow SH^{2+}+S^{2-}$ (SH: amphiprotic solvent)

Autoprotolysis constant: $pK_{SH}=[SH^{2+}]*[S^{2-}]/[SH]^2$

Acceptor number $A_N$ is a measure proposed by Mayer-Gutmann of acceptor property, i.e. a measure of a solvent as a Lewis acid. Taking the $^{31}$P-NMR chemical shift value of $(C2F5)3PO$ dissolved in n-hexane as 0, and the $^{31}$P-NMR chemical shift value of $(C2F5)3PO.SbCl_5$ complex in 1,2-dichloroethane as 100, $A_N$ is defined as the $^{31}$P-NMR chemical shift value of $(C2F5)3PO$ dissolved in the pure solvent.

$$A_N=100\delta(solvent)/[\delta((C2F5)3PO.SbCl_5 \text{ in } 1,2\text{-dichloroethane})-\delta((C2F5)3PO \text{ dissolved in } n\text{-hexane})]$$

Donor number $D_N$ is a measure proposed by Gutmann of donor property, i.e. the measure of a solvent as a Lewis base. $D_N$ is defined as the absolute value of the value that expresses the enthalpy of the reaction between $SbCl_5$ ($10^{-3}$ moldm$^{-3}$) in 1,2-dichloroethane and a solvent ($10^{-3}$ moldm$^{-3}$) in terms of kcal mol$^{-1}$.

$$D_N=-\Delta H \text{ (SbCl}_5\text{)/kcal mol}^{-1}$$

Organic solvents have an acceptor number and a donor number based on the above, even though many of them may not have been reported as measured values. The acceptor and donor properties of an organic solvent can be estimated to some extent. For example, as alkyl groups become larger, acceptor numbers tend to become smaller, as in the following: $A_N(HOH)=54.8$, $A_N(CH_3OH)=41.3$, $A_N(C_2H_5OH)=37.1$, $A_N(C_3H_7OH)=33.5$. The reason for this may be that a larger alkyl group provides a greater electron-donating I effect (Inductive Effect), increasing the electron density of the H in the hydroxy group —OH, and weakening the electron-accepting property. The $A_N$ of C4H9OH, although not reported, can be estimated to be 24 or more, based on $A_N(CHCl_3)=23.1$. In this manner, by comparison with a substance whose donor number and acceptor number are known, the donor and acceptor properties of another substance can be estimated in consideration of the change in the electron density of the atom that exhibits the donor and acceptor properties; and measured values such as those reported in the literature are not necessary. In an organic solvent, a strong acceptor property means high Lewis acidity.

Generally, solvents with an acceptor number of 20 or more are amphiprotic solvents, which are classified into neutral, protogenic, and protophilic solvents. Frequent transfer of a proton, i.e. a hydrogen ion, promotes etching in which hydrogen ions are involved.

In an organic solvent, a strong donor property means high Lewis basicity. In other words, a weak donor property means low Lewis basicity; therefore, as when the acceptor number is large, etching in which hydrogen ions are involved is promoted.

Hydrogen ions are deeply involved in the etching of silicon (Si)-containing compounds such as silicon nitride (SiN), silicon carbide (SiC), and silicon carbide nitride (SiCN), which are used as insulating film barriers. For the above-mentioned reasons, silicon (Si)-containing compounds such as SiN, SiC, and SiCN can be more easily etched than other silicon (Si)-containing compounds such as a low dielectric constant film (low-k film, which may be expressed in terms of its components such as SiOC and SiOC:H) containing silicon oxide ($SiO_2$) used as low-k film; silicon oxide (SiO2), which may be called BPSG, doped with phosphorus (P), arsenic (As), antimony (Sb), boron (B), etc.; organic components such as methyl groups (—CH$_3$); hydrogen; etc. Therefore, etching residue can be removed without etching the low-k film more than is necessary. There arise very few differences in level that conceal the low-k film behind the insulating film barrier, and the removal of residue causes little damage.

Furthermore, when at least one of the above organic acids and organic solvents is used, polar protophilic solvents having a donor number of at least 25, acids, fluorine-containing organic compounds, etc. may be added.

The addition of a polar protophilic solvent having a donor number of at least 25 reduces the capability for removing antireflection coatings and filling materials; however, it provides the effect of increasing the speed of removal of oxide films formed on wiring copper. If any copper oxide film remains, it may cause insulation failure. Therefore, copper oxide films as well as antireflection coatings and filling materials can be effectively removed. Examples of polar protophilic solvents having a donor number of at least 25 include amides such as dimethylformamide, dimethylacetamide, hexamethylphosphoric triamide, N-methyl-2-pyrrolidone, 1,1,3,3-tetramethylurea, N-methylpropionamide, and dimethyl imidazolidinone; and sulfur compounds such as dimethyl sulfoxide, sulfolane, dimethylthioformamide, N-methylthiopyrrolidone, dimethyl sulfone, diethyl sulfone, bis(2-hydroxyethyl)sulfone, and tetramethylene sulfone.

With the addition of an acid, the effects of hydrogen ions enable more selective removal of antireflection coatings and filling materials over low-k film and stopper film. Such acids are, for example, hydrogen chloride, hydrogen bromide, hydrogen iodide, and aqueous solutions thereof; sulfuric acid, nitric acid, phosphoric acid, and carboxylic acid.

The addition of a fluorine-containing organic compound enhances the permeability of the removal solution for antireflection coatings and filling materials. It becomes easy for the solution to permeate the interface between an antireflection coating or a filling material and other materials such as low-k film and stopper film, and as a result, its removing properties are enhanced. Examples of fluorine-containing organic compounds include hydrofluoroethers (HFE) such as CHF2CF2OCH2CF3 and CHF2CF2OCH3; and hydrochlorofluorocarbons (HCFC) such as CH3CCl2F.

It is desirable for the removing solution/cleaning solution of the present invention to contain hydrogen fluoride or a combination of hydrogen fluoride with ammonia and/or amines as a source for generating etching species. The etching species herein are active species effective for etching, such as active species that etch an insulating film barrier and low-k film or active species for dissolving a compound that has a Si—N bond in etching residue. When the etching residue contains organic components, it is preferable to use a large amount of organic acid and organic solvent to enhance the solubility of the residue. Hydrogen fluoride may be introduced as a gas, or may be added as 100% hydrogen fluoride liquid or as hydrofluoric acid (hydrogen fluoride diluted with water). Similarly, ammonia and amines may be added as gases or liquids.

However, when adding hydrogen fluoride, and ammonia and/or amines to a solution with a high content of organic solvent, it is undesirable to previously mix ammonia and/or amines with hydrogen fluoride, generating salts. This makes it difficult to dissolve them in the organic solvent. Usually, either hydrogen fluoride or ammonia and/or amines are previously added to an organic solvent, sufficiently mixed, and then the other is added thereto. Such a method can prevent the generation and crystallization of salts from the solution, and can dissolve them not as completely dissociated ions in an electrolytic solution of salts but as solvated ion pairs. One ion in the ion pair functions as an etching species.

The amount of hydrogen fluoride in the removing solution and the cleaning solution of the present invention is determined based on the desired effect of removing etching residue in consideration of the etching amount of an insulating film barrier and low-k film, and also of the etching amount of etching residue having Si—N bonds. Although dilute hydrofluoric acid (50 wt. % aqueous solution) is usually used to supply hydrogen fluoride, 100% hydrogen fluoride can also be used when the removing solution does not contain water. The amount of hydrogen fluoride is in the range of 0% to 10% by weight, based on the total amount of the removing solution/cleaning solution (hereinafter, the amount of each component is indicated based on the total amount of the removing solution/cleaning solution).

When only protogenic solvents are used in the removing solution/cleaning solution, the amount of hydrogen fluoride is about 0.05% to about 5% by weight, preferably about 0.1% to about 3% by weight, and more preferably about 0.5% to 3% by weight.

When the removing solution/cleaning solution contains a protogenic solvent, and a polar aprotic solvent having a donor number of no more than 24 and/or a neutral solvent, the amount of hydrogen fluoride is about 0.05% to about 10% by weight, preferably about 0.1% to about 5% by weight, and more preferably about 0.5% to 5% by weight.

When the removing solution/cleaning solution contains a neutral solvent and/or a polar aprotic solvent, the amount of hydrogen fluoride is about 0.1% to about 10% by weight, preferably about 0.5% to about 7% by weight, and more preferably about 1% to about 5% by weight.

When the removing solution/cleaning solution contains water, the amount of water is no more than about 90 mass %, preferably no more than about 10 mass %, and more preferably no more than about 5%.

The amount of said at least one member selected from the group consisting of polar aprotic solvents having a donor number of no more than 24, neutral solvents, and protogenic solvents is about 25 to about 99.99 mass %, preferably about 50 to about 99.99 mass %, more preferably about 85 to about 99.99 mass %, and even more preferably about 95 to about 99.99 mass %.

Preferable examples of removing solutions, cleaning solutions, and amounts of components in the present invention are given below.

HF/protogenic solvent/water=0.05-5 mass %/89.95-99.95 mass %/0-10 mass %

HF/polar aprotic solvent having a donor number of no more than 24/water=0.5-5 mass %/89.5-99.5 mass %/0-10 mass %

HF/neutral solvent/water=0.5-5 mass %/89.5-99.5 mass %/0-10 mass %

The following are more preferable examples of removing solutions, cleaning solutions, and amounts of components in the invention.

HF/acetic acid/water=0.05-5 mass %/85-99.95 mass %/0-10 mass %

HF/isopropanol/water=0.5-5 mass %/85-99.5 mass %/0-10 mass %

HF/acetic acid/IPA/water=0.1-5 mass %/1-98.9 mass %/1-98.9 mass %/0-10 mass %

HF/methanol/isopropanol/water 0.1-5 mass %/1-80 mass %/1-98.9 mass %/0-10 mass %

HF/1,2-dimethoxyethane/water=0.5-5 mass %/85-99.5 mass %/0-10 mass %

HF/at least one member selected from the group consisting of methyl acetate, ethyl acetate and butyl acetate/water=0.5-5 mass %/85-99.5 mass %/0-10 mass %

HF/1,4-dioxane/water=0.5-5 mass %/85-99.5 mass %/0-10 mass %

HF/propylene carbonate/water=0.5-5 mass %/85-99.5 mass %/0-10 mass %

HF/1,4-dioxane and at least one member selected from the group consisting of acetic acid and acetic anhydride/water=0.1-5 mass %/85-99.9 mass %/0-10 mass %

HF/ethylene glycol monomethyl ether/water=0.5-5 mass %/85-99.5 mass %/0-10 mass %

HF/methanesulfonic acid/water=0.001-5 mass %/85-99.999 mass %/0-10 mass %

The following are even more preferable examples of removing solutions, cleaning solutions, and amounts of components in the invention.

HF/acetic acid/water=0.1-5 mass %/85-99.88 mass %/0.02-10 mass %

HF/IPA/water=1-4 mass %/88-98.5 mass %/0.5-8 mass %

HF/acetic acid/IPA/water=0.1-5 mass %/1-98.85 mass %/1-98.85 mass %/0.05-10 mass %

HF/methanol/IPA/water=0.1-5 mass %/1-80 mass %/1-98.85 mass %/0.05-10 mass %

HF/1,2-dimethoxyethane/water=0.5-5 mass %/85-99.3 mass %/0.2-10 mass %

HF/at least one member selected from the group consisting of methyl acetate, ethyl acetate and butyl acetate/water=0.5-5 mass %/85-99.3 mass %/0.2-10 mass %

HF/1,4-dioxane/water=0.5-5 mass %/85-99.3 mass %/0.2-10 mass %

HF/propylene carbonate/water=0.5-5 mass %/85-99.3 mass %/0.2-10 mass % HF/1,4-dioxane and at least one member selected from the group consisting of acetic acid and acetic anhydride/water=0.1-5 mass %/85-99.9 mass %/0-10 mass %

HF/ethylene glycol monomethyl ether/water=0.5-5 mass %/85-99.3 mass %/0.2-10 mass %

HF/methanesulfonic acid/water=0.001-5 mass %/85-99.998 mass %/0.001-10 mass %

To the above solutions may be added ammonia and/or amines, polar protophilic solvents having a donor number of at least 25, acids, fluorine-containing organic compounds, etc. The weight ratio of HF (hydrogen fluoride)/ammonia and/or amine/at least one organic acid and/or organic solvent/water/acid/polar protophilic solvent having a donor number of at least 25/fluorine-containing organic compound is preferably in the range of 0.05-5 mass %/0.05-10 mass %/50-99.83 mass %/0.02-10 mass %/0.05-50 mass %/0-70 mass %.

Furthermore, in the removal of etching residues, antireflection coatings and filling materials can be removed separately from or simultaneously with low-k film damaged by dry etching and by subsequent plasma ashing with oxygen, hydrogen, nitrogen, noble gas, etc. (removal of resist and polymers by a plasma process). Depending on the chemical composition of the solution, it is also possible to remove antireflection coatings and filling materials without removing damaged low-k film.

In wiring materials such as copper and copper alloys, corrosion is accelerated when a removing solution contains a large amount of dissolved oxygen, hydrogen ions, etc. In particular, the amount of dissolved oxygen is an important factor in controlling copper corrosion. If the amount of dissolved oxygen in a removing solution can be reduced, copper corrosion can be greatly inhibited. In this manner, when a metal such as wiring copper is present, corrosion can be inhibited by using a removing solution wherein one or more inert gases are dissolved such that the oxygen partial pressure of the solution is below the oxygen partial pressure in air-saturated solution, under an atmosphere (substantially in inert gas) wherein one or more inert gases are mixed such that the atmosphere has an oxygen partial pressure below the oxygen partial pressure in air, for removing resist, antireflection coatings, and etching residues including these. In this case, rinsing off the removing solution by the use of water wherein one or more inert gases are dissolved such that the oxygen partial pressure in the water is below the oxygen partial pressure in air-saturated solution is further effective in that corrosion in the rinsing process can also be inhibited. Examples of inert gases include noble gases such as nitrogen (N2), helium, neon, and argon. Furthermore, usable additives are, for example, deoxidizers such as sulfurous acid and sulfites (such as ammonium sulfite); and generally used anticorrosives such as pyrogallol, phthalic acid, benzotriazol, and D-sorbitol. These are effective for the inhibition of copper corrosion.

The present invention provides a resist-removing solution that can be used to remove resist without damaging low-k film. The invention also provides a cleaning solution for removing titanium compounds remaining in via holes, capacitors, etc.; and a cleaning solution for via holes, capacitors, etc. that can be used to remove titanium compounds, etc.

BEST MODE FOR CARRYING OUT THE INVENTION

The present invention is described below in more detail with reference to Examples. However, the present invention is not limited to these examples.

The etching amounts shown below were obtained by etching each film at 23° C. using each composition and calculating the difference in film thickness between before and after etching.

The SiN film etching rates below were obtained by measuring film thickness before and after etching, using a "Nano-Spec 3000 AF-T" (product of Nanometrics Japan Ltd.). The metal [TiN film] etching rates were obtained by measuring resistivity before and after etching, using a resistivity meter "K-705RS" (product of Kyowariken, Inc.), and calculating film thickness based on the measured resistivity.

Resist removability and cross-sectional profile were observed by micrography using a scanning electron microscope "S-5000" (product of Hitachi, Ltd.).

TEST EXAMPLE 1

Resist Removability

A Si substrate, with a low-k film (porous MSQ), a SiN film, an antireflection coating (BARC), and a resist (KrF) film formed over it, was subjected to etching, giving an object to be treated that had resist (including resist surface modified by etching) on the surface of the SiN film.

Each such object was immersed in one of the removing solutions shown below in Tables 1 to 4 at 23° C., with stirring for a predetermined period of time. The SP values of the organic acids and organic solvents that were used are as follows:

acetic acid: 10.1 hexanol: 10.7 lauryl alcohol: 9.8 propylene glycol: 12.6 diethylene glycol: 12.1 glycerin: 16.5

IPA: 11.5

Light $O_2$ plasma ashing was conducted by carrying out $O_2$ plasma ashing for a shorter time than usual such that the low-k film was substantially not damaged.

In the "resist removability" columns of the tables, "A," "B," and "C" mean excellent, good, and poor, respectively.

TABLE 1

| | Components (mass %) | | | Immersion time (min) | Light $O_2$ plasma ashing | Resist removability | Etching amount of SiN film (Å) |
|---|---|---|---|---|---|---|---|
| | HF | Water | Acetic acid | | | | |
| Ex. 1 | 0.05 | 0.05 | 99.9 | 30 | Not conducted | A | 39 |
| Ex. 2 | 0.05 | 0.05 | 99.9 | 40 | Not conducted | A | 52 |
| Ex. 3 | 0.1 | 0.1 | 99.8 | 20 | Not conducted | A | 56 |
| Ex. 4 | 0.15 | 0.15 | 99.7 | 15 | Not conducted | A | 51 |
| Ex. 5 | 0.2 | 0.2 | 99.6 | 3 | Not conducted | A | 15 |
| Ex. 6 | 0.2 | 0.2 | 99.6 | 6 | Not conducted | A | 30 |
| Ex. 7 | 0.25 | 0.25 | 99.5 | 5 | Not conducted | A | 35 |
| Ex. 8 | 0.25 | 0.25 | 99.5 | 10 | Not conducted | A | 62 |
| Ex. 9 | 04 | 04 | 99.2 | 10 | Not conducted | A | 60 |
| Ex. 10 | 0.5 | 0.5 | 99.0 | 10 | Not conducted | A | 75 |
| Ex. 11 | 0.75 | 0.75 | 98.5 | 0.5 | Not conducted | A | 10 |
| Ex. 12 | 0.75 | 0.75 | 98.5 | 1 | Not conducted | A | 20 |
| Ex. 13 | 0.75 | 0.75 | 98.5 | 3 | Not conducted | A | 60 |
| Ex. 14 | 0.05 | 0.05 | 99.9 | 15 | Conducted | A | 20 |
| Ex. 15 | 0.05 | 0.05 | 99.9 | 25 | Conducted | A | 53 |
| Ex. 16 | 0.1 | 0.1 | 99.8 | 20 | Conducted | A | 56 |
| Ex. 17 | 0.15 | 0.15 | 99.7 | 15 | Conducted | A | 51 |
| Ex. 18 | 0.2 | 0.2 | 99.6 | 10 | Conducted | A | 47 |
| Ex. 19 | 0.25 | 0.25 | 99.5 | 3 | Conducted | A | 21 |
| Ex. 20 | 0.25 | 0.25 | 99.5 | 5 | Conducted | A | 35 |
| Ex. 21 | 0.25 | 0.25 | 99.5 | 10 | Conducted | A | 62 |
| Ex. 22 | 0.4 | 0.4 | 99.2 | 10 | Conducted | A | 60 |
| Ex. 23 | 0.5 | 0.5 | 99.0 | 10 | Conducted | A | 75 |

TABLE 1-continued

|  | Components (mass %) | | | Immersion time (min) | Light $O_2$ plasma ashing | Resist removability | Etching amount of SiN film (Å) |
|---|---|---|---|---|---|---|---|
|  | HF | Water | Acetic acid | | | | |
| Ex. 24 | 0.75 | 0.75 | 98.5 | 0.5 | Conducted | A | 10 |
| Ex. 25 | 0.75 | 0.75 | 98.5 | 1 | Conducted | A | 20 |
| Ex. 26 | 0.75 | 0.75 | 98.5 | 3 | Conducted | A | 60 |

TABLE 2

|  | Components | Immersion time (min) | Light $O_2$ plasma ashing | Resist removability | Etching amount of SiN film (Å) |
|---|---|---|---|---|---|
| Ex. 27 | 1 mass % HF + 1 mass % $H_2O$ + hexanol | 10 | Not conducted | A | 251 |
| Ex. 28 | 0.4 mass % HF + 0.4 mass % $H_2O$ + lauryl alcohol | 10 | Not conducted | A | 283 |
| Ex. 29 | 1.5 mass % HF + 1.5 mass % $H_2O$ + propylene glycol | 5 | Not conducted | A | 22 |
| Ex. 29 | 1.5 mass % HF + 1.5 mass % $H_2O$ + propylene glycol | 10 | Not conducted | A | 48 |
| Ex. 30 | 1.5 mass % HF + 1.5 mass % $H_2O$ + propylene glycol | 15 | Not conducted | A | 72 |
| Ex. 31 | 2.5 mass % HF + 2.5 mass % $H_2O$ + propylene glycol | 10 | Not conducted | A | 203 |
| Ex. 32 | 1.5 mass % HF + 1.5 mass % $H_2O$ + ethylene glycol | 10 | Not conducted | A | 180 |
| Ex. 33 | 2 mass % HF + 2 mass % $H_2O$ + diethylene glycol | 7.5 | Not conducted | A | 40 |
| Ex. 34 | 2 mass % HF + 2 mass % $H_2O$ + diethylene glycol | 10 | Not conducted | A | 87 |
| Ex. 35 | 3 mass % HF + 3 mass % $H_2O$ + glycerin | 10 | Not conducted | A | 480 |
| Ex. 36 | 1.5 mass % HF + 1.5 mass % $H_2O$ + IPA | 10 | Not conducted | A | 41 |
| Ex. 37 | 1.5 mass % HF + 1.5 mass % $H_2O$ + IPA | 15 | Not conducted | A | 62 |
| Ex. 38 | 1 mass % HF + 1 mass % $H_2O$ + hexanol | 10 | Conducted | A | 251 |
| Ex. 39 | 0.4 mass % HF + 0.4 mass % $H_2O$ + lauryl alcohol | 10 | Conducted | A | 283 |
| Ex. 40 | 2.5 mass % HF + 2.5 mass % $H_2O$ + propylene glycol | 10 | Conducted | A | 203 |
| Ex. 41 | 1.5 mass % HF + 1.5 mass % $H_2O$ + ethylene glycol | 10 | Conducted | A | 180 |
| Ex. 42 | 2 mass % HF + 2 mass % $H_2O$ + diethylene glycol | 10 | Conducted | A | 40 |
| Ex. 43 | 3 mass % HF + 3 mass % $H_2O$ + glycerin | 10 | Conducted | A | 480 |

* In Table 2, the amount of the component that is not HF or $H_2O$ is the balance obtained by subtracting the amounts of HF and $H_2O$ from the total amount.

TABLE 3

|  | Components (mass %) | | | Immersion time (min) | Light $O_2$ plasma ashing | Resist removability |
|---|---|---|---|---|---|---|
|  | $NH_4F$ | Water | Acetic Acid | | | |
| Comp. Ex. 1 | 0 | 0 | 100 | 10 | Not conducted | C |
| Comp. Ex. 2 | 0 | 0 | 100 | 10 | Conducted | C |

TABLE 4

|  | Component | Immersion Time (min) | Light $O_2$ plasma ashing | Resist removability |
|---|---|---|---|---|
| Comp. Ex. 3 | IPA | 10 | Not conducted | C |
| Comp. Ex. 4 | IPA | 10 | Conducted | C |

** In Table 4, concentration is expressed as the number of moles per kg of the total composition.

The resist was completely removed from the substrates treated with the removing solutions of Examples 1 to 46. The antireflection coating was also removed. In all these substrates, the SiN film with antireflection coating adhering thereto was etched to a depth of at least 1 Å. On the other hand, the resist was not removed in the substrates treated with the solutions of Comparative Examples 1 to 3.

TEST EXAMPLE 2

Cross-sectional Profile

The vertical cross-section of each treated substrate was observed by SEM in comparison with that of the untreated substrate to check the effects of the removing solutions on low-k film in Examples 1, 5, 6, 7, 11, 12, 14, 15, 19, 20, 24, 25, 29, 30, 33, 34, 36, 37, and 42.

The profile of the substrate was substantially unchanged before and after the treatment with the removing solutions in Examples 1, 5, 6, 7, 11, 12, 14, 15, 19, 20, 24, 25, 29, 30, 33, 34, 36, 37, and 42. It was thus confirmed that the low-k film was not damaged.

The removing solution of the present invention was found to be capable of removing resist without substantially damaging low-k film.

COMPARATIVE EXAMPLE 4

$HF/H_2O$=15 Mass %/85 Mass % (23° C.; 10 Minutes; Light $O_2$ Plasma Ashing Conducted or Not Conducted)

In Comparative Example 4, although it was possible to remove the resist, the low-k film was damaged, being removed together with the resist.

TEST EXAMPLE 3

Polymer/titanium Compound Removability

A resist film was formed over a Si wafer having an oxide film with an underlying TiN film, subjected to dry etching and $O_2$ plasma ashing, thus giving an object to be treated that had via holes. Polymers and titanium compounds remained on the sidewalls and the bottoms of the via holes.

The object was immersed in the following cleaning solution (Example 44) with stirring at 23° C. for a predetermined period of time.

EXAMPLE 44

$HF/H_2O$/Acetic Acid=0.75 Mass %/0.75 Mass %/98.5 Mass % (10 Minutes)

The treatment with the cleaning solution of Example 44 removed the polymers and titanium compounds remaining in the via holes, thus cleaning the via holes. The TiN film was etched to a depth of 2.4 Å.

TEST EXAMPLE 4

Resist Residue Removability Test

A resist film was formed over a Si wafer having TiN (upper layer)/$Ta_2O_5$ (lower layer) with an underlying silicon oxide film, subjected to dry etching of TiN (upper layer)/$Ta_2O_5$ (lower layer) and $O_2$ plasma ashing, thus giving an object to be treated that had metal capacitor electrodes. Resist residue remained on the surface of the electrodes.

Each such object was immersed in one of the following cleaning solutions (Examples 45 and 46) with stirring at 23° C. for a predetermined period of time.

EXAMPLE 45

$HF/H_2O$/Acetic Acid=1.5 Mass %/1.5 Mass %/97 Mass % (10 Minutes)

EXAMPLE 46

$HF/H_2O$/Acetic Acid=3 Mass %/3 Mass %/96 Mass % (10 Minutes)

The treatments with the cleaning solutions of Example 45 and 46 removed the resist residue remaining on the surface of the metal capacitor electrodes, thus cleaning the capacitors. The TiN film was etched to a depth of 6.2 Å in Example 45, and to a depth of 12 Å in Example 46.

If resist residue on the surface of capacitor electrodes can be removed, and polymers and titanium compounds remaining in via holes can be removed, then it is expected that polymers and titanium compounds on the surface of capacitor electrodes can also be removed.

EXAMPLES 47 TO 50

A Si substrate with a low-k film [CVD] and a resist film [KrF] formed thereover was subjected to etching, giving an object to be treated that had resist (including resist modified by etching) on the surface of the low-k film and had polymers in the resulting holes. Ashing of the resist was not performed.

The removing solutions of Examples 47 to 50 were prepared, using the components shown below. Each object to be treated was immersed in one of the removing solutions, and cleaning was performed with ultrasonic irradiation [950 kHz, 600 W] for the lengths of time shown in Table 5. The equipment used for ultrasonic cleaning was a "HI MEGASONIC" high-frequency ultrasonic cleaning system (generator: model 6848; vibrator: model 7857S) produced by Kaijo Corporation.

The resist was completely removed from the substrates treated with the removing solutions of Examples 47 to 50. The polymers were also removed.

Removing solutions containing hydrofluoric acid and amine were prepared using the organic solvents shown in Table 6 below, and ultrasonic cleaning was performed. It was possible to remove the resist and the polymers.

Since the above test example confirmed that the compositions shown in Tables 5 and 6 remove polymers in via holes, the compositions are expected to be capable of removing titanium compounds remaining in via holes. These compositions are also expected to be capable of removing resist residue, polymers, and titanium compounds on the surface of capacitor electrodes.

TABLE 5

| | | Solvent | HF | Amine | Ultrasonic Irradiation time | Resist Removability |
|---|---|---|---|---|---|---|
| Polyhydric alcohol | Ex. 47 | Ethylene glycol | 1 mol/kg | Monoethanolamine 0.5 mol/kg | 10 min | A |
| Amide | Ex. 48 | N,N- | 0.02 | Monoethanolamine | 20 min | A |

TABLE 5-continued

| | Solvent | HF | Amine | Ultrasonic Irradiation time | Resist Removability |
|---|---|---|---|---|---|
| Ex. 49 | dimethylformamide N,N-dimethylformamide | mol/kg 0.02 mol/kg | 0.01 mol/kg Ethylamine 0.01 mol/kg | 20 min | A |
| Ex. 50 | N-methylformamide | 0.5 mol/kg | Monoethanolamine 0.25 mol/kg | 10 min | A |

TABLE 6

| | | Solvent |
|---|---|---|
| Ester | Ex. 51 | Butyl acetate |
| | Ex. 52 | Dimethyl phthalate |
| | Ex. 53 | Propylene carbonate |
| Ketone | Ex. 54 | Methyl isobutyl ketone |
| | Ex. 55 | Cyclohexanone |
| Alcohol | Ex. 56 | 1-dodecanol |
| | Ex. 57 | 1-hexanol |
| | Ex. 58 | 1-butanol |
| | Ex. 59 | Isopropyl alcohol |
| | Ex. 60 | 1-propanol |
| Polyhydric alcohol | Ex. 61 | Propylene glycol |
| Nitrogen-containing compound | Ex. 62 | N-methyl-2-pyrrolidone |
| | Ex. 63 | Tetramethylurea |
| Phosphate ester | Ex. 64 | Trimethyl phosphate |
| | Ex. 65 | Triethyl phosphate |
| Alkylene glycol monoalkyl ether | Ex. 66 | 2-ethoxyethanol |

EXAMPLE 5

Resist Removability

A Si substrate with a porous low-k film (porous MSQ), a SiC film, a silicon-containing antireflection coating (BARC), and a resist (KrF) film formed thereover was subjected to via etching, giving an object to be treated with a damascene structure before the formation of copper wiring, the object having the resist (including resist surface modified by etching) and antireflection coating on the surface of the SiN film, and having etching residue in via holes. Each such object was immersed in one of the cleaning solutions shown in Table 7 at 23° C. with stirring for a predetermined period of time.

EXAMPLES 67 TO 83

In Examples 67 to 83, after producing the above object to be treated, plasma treatment such as oxygen ashing was not performed for removing the resist, antireflection coating, and etching residue. When the removing solutions of Examples 67 to 83 shown in Table 7 were used, in the treatment time, SiC was etched to a depth of at least 1 Å, and SiN was etched to a depth of at least 12 Å. The resist, antireflection coating, and etching residue were all completely removed from the substrates that were treated with these removing solutions. Solvents that are effective for etching SiN, i.e., for dissolving etching residue containing silicon nitrides such as SiN are, as shown here, amphiprotic solvents such as neutral solvents (methanol, ethanol, isopropanol) and protogenic solvents (trifluoroacetic acid, acetic acid, formic acid); and aprotic solvents such as polar aprotic solvents having a donor number of no more than 24 (1,2-dimethoxyethane, tetrahydrofuran, methyl acetate, ethyl acetate, 1,4-dioxane, propylene carbonate, and acetone). The examples show that when these solvents are used, the removing solutions are highly effective for removing resist, antireflection coating, and etching residue. These examples confirm that when the concentration of HF is increased, the removing solution becomes more effective for the removal of resist, antireflection coating, and etching residue. Moreover, etching of SiC to a depth of at least 1 Å enhances the effect of stripping resist, antireflection coating, and etching residue at each interface, thus removing them.

When a higher concentration of HF than shown in Example 71 is used in combination with ethanol, copper corrosion occurs. In the other Examples in Table 7, almost no copper corrosion occurs, therefore causing substantially no problems.

On the other hand, the resist, antireflection coating, and etching residue were not removed from the substrates treated with the solutions of Comparative Examples 5 to 9 in Table 8. Etching of SiC to a depth of at least 1 Å is not sufficient for effectively removing resist, antireflection coating, and etching residue. To remove these, the etching of both SiN and SiC is required. The solutions of Comparative Examples 5 to 9 readily corrode copper, and when a single solvent such as shown in the examples is used, they are not suitable as removing solutions.

Furthermore, Examples 67 to 83 and Comparative Examples 5 to 9 prove that when using an amphiprotic solvent with a large autoprotolysis constant and a large donor number, and when using an aprotic solvent with a small donor number, the corrosion of copper is reduced. Solvents that have a large autoprotolysis constant and a large donor number are, for example, among alcohols, isopropanol (IPA), 1-propanol, and t-butanol. Aprotic solvents that have a small donor number are polar aprotic solvents having a donor number of no more than 24, such as esters, ethers, ketones, and acid anhydrides. In contrast, copper is readily corroded when using an amphiprotic solvent that has a small autoprotolysis constant and a small donor number, and when using a polar protophilic solvent having a donor number of at least 24. Amphiprotic solvents that have a small autoprotolysis constant and a small donor number are, for example, among alcohols, methanol, ethanol, etc. Polar protophilic solvents having a donor number of at least 25 are, for example, amides such as dimethylformamide and sulfur-containing compounds such as dimethyl sulfoxide.

In Comparative Examples 5 to 9, if the concentration of HF is increased, removability can be somewhat improved; however, it does not bring about any great effect. Also, in those portions where copper wiring is exposed, the corrosion of copper is accelerated, making the use of such solutions difficult. However, the organic solvents used in Comparative Examples 5 to 9 are effective for removing native copper oxide films. It is desirable to remove native copper oxide films because these increase wiring resistance and may cause poor contact. The organic solvents used in Comparative Examples 5 to 9 can be mixed into the solutions of Examples 67 to 83 to remove only the native oxide films of copper while removing resist, antireflection coating, and etching residue in a length of treatment time that causes little copper corrosion. In Table 9, Comparative Examples 11 and 12 are examples of treatment with chemical solutions of typical composition used as polymer removing solutions for forming an Al/SiO2 multi-level interconnection structure. In these examples, although there was not much copper corrosion, the resist, antireflection coating, and etching residue were not removed. If treatment time is lengthened, removability can be somewhat improved; however, the corrosion of copper is promoted, and the amount of etched low-k film is increased, thus making accurate processing difficult.

In addition, the results in the Examples and the Comparative Examples were almost the same as those obtained when ashing treatment was performed by plasmas such as oxygen plasma, hydrogen plasma, or water plasma.

TABLE 7

| Ex. No. | HF mass % | Components | | | | Water mass % | Physical properties of Organic solvent | | |
|---|---|---|---|---|---|---|---|---|---|
| | | Organic acid and Organic solvent | | | | | Acceptor number | Donor number | Auto-protolysis constant |
| | | Kind | mass % | Kind | mass % | | | | |
| 67 | 0.4 | Trifluoroacetic acid | 98.2 | — | — | 0.4 | 105.3 | — | — |
| 68 | 1.0 | Formic acid | 96.1 | — | — | 1.0 | 83.6 | 19.0 | 6.2 |
| 69 | 0.7 | Acetic acid | 98.5 | — | — | 0.8 | 52.9 | 2.0 | 14.5 |
| 70 | 0.2 | Acetic acid | 99.6 | — | — | 0.2 | 52.9 | 2.0 | 14.5 |
| 71 | 1.0 | Ethanol | 97.6 | — | — | 1.0 | 37.9 | 32.0 | 18.9 |
| 72 | 0.8 | Isopropyl alcohol | 98.5 | — | — | 0.8 | 33.6 | 36.0 | 20.8 |
| 73 | 0.8 | Acetone | 97.5 | — | — | 0.8 | 12.5 | 17.0 | >32.5 |
| 74 | 0.5 | 1,4-dioxane | 98.0 | — | — | 0.5 | 10.8 | 14.8 | — |
| 75 | 0.6 | Methyl acetate | 98.3 | — | — | 0.6 | 10.7 | 16.5 | — |
| 76 | 0.5 | Ethyl acetate | 98.5 | — | — | 0.5 | 9.3 | 17.1 | 22.8 |
| 77 | 0.5 | 1,2-dimethoxyethane | 98.0 | — | — | 0.5 | 10.2 | 23.9 | — |
| 78 | 2.3 | 1,2-dimethoxyethane | 94.5 | — | — | 2.3 | 10.2 | 23.9 | — |
| 79 | 0.6 | Tetrahydrofuran | 97.8 | — | — | 0.6 | 8.0 | 20.0 | — |
| 80 | 2.0 | 1,4-dioxane | 83.6 | Acetic anhydride | 11.4 | 2.0 | 11.0 | 14.8 | — |
| 81 | 2.0 | 1,4-dioxane | 83.6 | Acetic acid | 22.8 | 0.0 | 11.0 | 14.8 | — |
| 82 | 0.6 | 1,2-dimethoxyethane | 58.9 | Acetic acid | 39.3 | 0.6 | 32.0 | 23.9 | — |
| 83 | 0.6 | Triethylene glycol dimethyl ether | 58.9 | — | — | 0.6 | — | — | — |

| Ex. No. | Treatment time min | Etching amount | | Etching amount ratio SiN/ Low-k film | Corrosion Copper | Removability | | | Profile |
|---|---|---|---|---|---|---|---|---|---|
| | | SiC Å | SiN Å | | | Resist | BARC | Residue | |
| 67 | 1.0 | 6.4 | 31.0 | 1.3 | A | A | A | A | A |
| 68 | 05 | 2.6 | 33.1 | 1.1 | A | A | A | A | A |
| 69 | 0.7 | 3.2 | 11.5 | 0.6 | A | A | A | A | A |
| 70 | 3.0 | 2.0 | 14.1 | 0.4 | A | A | A | A | A |
| 71 | 7.5 | 1.0 | 30.0 | 0.3 | B | A | A | A | A |
| 72 | 7.5 | 1.8 | 27.9 | 0.4 | A | A | A | A | A |
| 73 | 10.0 | 1.0 | 24.4 | 0.3 | A | A | A | A | A |
| 74 | 5.0 | 4.0 | 22.4 | 0.8 | A | A | A | A | A |
| 75 | 5.0 | 1.0 | 22.6 | 0.4 | A | A | A | A | A |
| 76 | 10.0 | 2.2 | 55.2 | 1.1 | A | A | A | A | A |
| 77 | 15.0 | 2.4 | 30.6 | 1.0 | A | A | A | A | A |
| 78 | 5.0 | 1.6 | 53.2 | 0.9 | A | A | A | A | A |
| 79 | 10.0 | 2.6 | 32.0 | 0.4 | A | A | A | A | A |
| 80 | 5.0 | 1.6 | 33.2 | 1.0 | A | A | A | A | A |
| 81 | 5.0 | 1.6 | 33.2 | 1.0 | A | A | A | A | A |
| 82 | 10.0 | 7.0 | 41.2 | 0.3 | A | A | A | A | A |
| 83 | 5.0 | 4.3 | 60.0 | 1.9 | A | A | A | A | A |

A: Excellent,
B: Good,
C: Poor,
—: No evaluation

TABLE 8

| Comp. Ex. No. | HF mass % | Components | | Water mass % | Physical properties of organic solvent | | | Treatment time min | Etching amount | | Etching ratio SiN/ Low-k film | Corrosion Copper | Removability | | | Profile |
|---|---|---|---|---|---|---|---|---|---|---|---|---|---|---|---|---|
| | | Organic solvent | | | Acceptor number | Donor Number | Autoprotolysis constant | | SiC Å | SiN Å | | | Resist | BARC | Residues | |
| | | Kind | mass % | | | | | | | | | | | | | |
| 5 | 0.58 | DMSO | 97.9 | 0.58 | 19.3 | 29.9 | 33.3 | 5 | 0.6 | 3 | 0.1 | C | C | C | C | — |
| 6 | 0.62 | DMF | 98.3 | 0.62 | 16.0 | 26.6 | 29.4 | 5 | 1.8 | 5 | 0.1 | C | B | B | C | — |
| 7 | 0.53 | DMA | 98.0 | 0.53 | 13.6 | 27.8 | 23.9 | 5 | 1.2 | 0 | 0.0 | C | B | B | C | — |
| 8 | 0.46 | NMP | 98.1 | 0.46 | 13.3 | 27.3 | 25.6 | 5 | 0.0 | 0 | 0.0 | C | C | C | C | — |
| 9 | 0.40 | DMI | 99.2 | 0.40 | — | — | — | 5 | 1.4 | 4 | 0.1 | C | B | B | C | — |
| 10 | 0.50 | — | — | 99.50 | — | — | — | 5 | 2.0 | 650 | 0.1 | C | C | C | C | C |

DMSO (dimethyl sulfoxide),
DMF (dimethylformamide),
DMA (dimethylacetamide),
NMP (N-methylpyrrolidone),
DMI(dimethyl imidazolidinone)
A: Excellent,
B: Good,
C: Poor,
—: No evaluation

TABLE 9

| Comp. Ex. No. | NH4F mass % | Components | | Water mass % | Physical properties of organic solvent | | | Treatment time min | Etching amount | | ratio Sin/ Low-k film | Corrosion Copper | Removability | | | Profile |
|---|---|---|---|---|---|---|---|---|---|---|---|---|---|---|---|---|
| | | Organic solvent | | | Acceptor number | Donor Number | Autoprotolysis constant | | SiC Å | SiN Å | | | Resist | BARC | Residues | |
| | | Kind | mass % | | | | | | | | | | | | | |
| 11 | 0.6 | DMF | 70.6 | 29 | 19.3 | 29.9 | 33.3 | 5 | 0 | 5 | 0.1 | B | C | C | C | — |
| 12 | 0.6 | DMSO | 69 | 30.4 | 16.0 | 26.6 | 29.4 | 5 | 0 | 4 | 0.1 | B | C | C | C | — |

DMSO (dimethyl sulfoxide),
DMF (dimethylformamide)
A: Excellent,
B: Good,
C: Poor,
—: No evaluation In Table 10, Comparative Examples 13 to 43 show the results of treating an object to be treated in the present invention, using the compositions, etc. for removing solutions or cleaning solutions described in the examples of other patent applications that have been filed. Most of the removing solutions and cleaning solutions shown in these Comparative Examples were developed for use in the formation of an Al/SiO2 multilevel interconnection structure.

Comparative Examples 13 to 16 show the results of treating an object to be treated in the present invention, using the composition described in the examples of Japanese Unexamined Patent Publication No. 1989-146331. The composition is a cleaning solution composed of hydrogen fluoride, isopropanol, and water, wherein the concentration of hydrogen fluoride is 0.5% or less by weight. This cleaning solution cannot selectively etch an insulating film barrier or a silicon nitride (SiN) film, so that it has a poor capability for removing resist, antireflection coating, and etching residue. The results also show that when the cleaning solution has a high water content, the resist and antireflection coating (BARC), which are organic compositions, cannot be removed, reducing etching residue removability, and that copper is heavily corroded.

Comparative Examples 17 to 19 also show the results of treating an object to be treated in the present invention, using the composition described in the examples of Japanese Unexamined Patent Publication No. 1989-146331. These are examples in which the cleaning solution, when using acetic acid as the organic solvent, has a high or very high water content. Since the cleaning solution has a high water content as compared to HF concentration, it cannot remove resist, antireflection coating (BARC), and etching residue. As the content of water increases, the amount of etched SiC decreases, and the amount of etched SiN and low-k film increases, thus making accurate processing difficult.

Comparative Examples 20 and 21 show the results of treating an object to be treated in the present invention, using the composition described in the examples of Japanese Unexamined Patent Publication No. 1996-202052. In Comparative Example 20, since the amount of etched SiC is small, resist and antireflection coating (BARC) cannot be removed. In Comparative Example 21, since the effect of selectively etching silicon nitride (SiN) over low-k film is low, the etching residue cannot be removed. The selective etching ratio of SiN to Low-k film is so low that if treatment time is lengthened to remove resist, antireflection coating (BARC), and etching residue, the amount of etched low-k film will be increased, thus making accurate processing difficult. Japanese Unexamined Patent Publication No. 1996-202052 mentions sulfoxides, amides, polyhydric alcohols, etc. as effective organic solvents. Sulfoxides and amides readily corrode copper, and particularly dimethyl sulfoxide, which is mentioned in the examples, heavily corrodes copper. Since anticorrosives are used, it is clear that copper is not intended as a wiring material. In contrast, the present invention uses organic solvents that do not require any anticorrosives. It is thus clear that the composition disclosed in Japanese Unexamined Patent Publication No. 1996-202052 is not suitable as a removing solution used in the formation of a Cu/low-k multilevel interconnection structure.

Comparative Example 22 shows the results of treating an object to be treated in the present invention, using the composition described in the examples of Japanese Unexamined Patent Publication No. 1998-50647. This composition can etch SiC and SiN only in small amounts, and cannot remove any of resist, antireflection coating (BARC), and etching residue. The selective etching ratio of SiN to the Low-k film is so low that if treatment time is lengthened for the removal of resist, antireflection coating (BARC), and etching residue, the amount of etched low-k film will be increased, thus making accurate processing difficult.

Comparative Examples 23 to 25 and Comparative Examples 26 show the results of treating an object to be treated in the present invention, using the compositions described in the examples of U.S. Pat. No. 6,150,282 and U.S. Pat. No. 6,150,282, respectively.

In Comparative Examples 23 to 25, when propylene carbonate is used as a solvent, little copper corrosion occurs, and etching residue removability is not poor. However, the removability for BARC and resist is poor, so that they cannot be completely removed. In addition, processing accuracy is not high.

In Comparative Example 26, the composition contains substantially no water, causing little metal corrosion. Without water, silicon nitride (SiN) cannot be selectively removed over low-k film; therefore, etching residue removability becomes particularly poor. In this case, resist and antireflection coating (BARC) cannot be removed, either.

Comparative Examples 26 to 35 show the results of treating an object to be treated in the present invention, using the composition described in the examples of Japanese Unexamined Patent Publication No. 1999-340183. When the concentration of HF is low, the etching rate of SiC and SiN is low, so that resist, antireflection coating (BARC), and etching residue cannot be removed. When the concentration of HF is increased, heavy copper corrosion occurs since methanol is used as a solvent. Therefore, the composition is not suitable as a removing solution used for a Cu/low-k multilevel interconnection structure.

Comparative Examples 36 to 41 show the results of treating an object to be treated in the present invention, using a composition as in the examples of Japanese Unexamined Patent Publication No. 1999-340183, except that isopropanol (IPA) was used as the organic solvent in place of methanol. Even with the use of isopropanol, when the concentration of HF is low or when the concentration of HF is high but the content of water is low, resist, antireflection coating (BARC), and etching residue cannot be removed.

Comparative Examples 42 and 43 show the results of using acetic acid as the organic solvent, with a high concentration of HF and with a low concentration of HF, respectively. When HF concentration is low, none of the resist, antireflection coating, and etching residue can be removed. When HF concentration is high, all of the resist, antireflection coating, and etching residue can be removed; however, stripping occurs at the interface between the SiC insulating film barrier and low-k film, promoting the side etching of the low-k film. As a result, the intended profile cannot be achieved.

TABLE 10

| Comp. Ex. No. | HF mass % | Components Organic solvent Kind | mass % | Water mass % | Anticorrosive Kind | mass % | Treatment time min | Etching amount SiC Å | Etching amount SiN Å | Etching amount ratio SiN/Low-k film | Corrosion Copper | Removability Resist | Removability BARC | Residues | Profile |
|---|---|---|---|---|---|---|---|---|---|---|---|---|---|---|---|
| 13 | 0.3 | Isopropanol | 16.4 | 83.3 | — | — | 5.0 | 0.2 | 31.0 | 0.5 | C | C | C | C | C |
| 14 | 0.3 | | 34.3 | 65.3 | — | — | 5.0 | 0.3 | 30.0 | 0.5 | C | C | C | C | C |
| 15 | 0.3 | | 53.9 | 45.7 | — | — | 5.0 | 0.3 | 28.0 | 0.5 | C | C | C | C | C |
| 16 | 0.3 | | 75.5 | 24.2 | — | — | 5.0 | 0.4 | 25.0 | 0.4 | C | C | C | B | C |
| 17 | 0.3 | Acetic acid | 10.7 | 89.0 | — | — | 2.0 | 0.4 | 50.0 | 0.5 | A | C | C | C | — |
| 18 | 0.3 | | 31.5 | 68.2 | — | — | 2.0 | 0.6 | 35.0 | 0.5 | A | C | C | C | — |
| 19 | 0.3 | | 61.5 | 38.2 | — | — | 2.0 | 0.7 | 25.0 | 0.6 | A | C | C | B | — |
| 20 | 2.0 | Diethylene glycol monobutyl ether | 86.0 | 2.0 | Catechol | 10.0 | 1.0 | 0.5 | 10.0 | 0.1 | A | C | C | C | C |
| 21 | 5.0 | Dimethyl sulfoxide | 80.0 | 5.0 | Catechol: Salicylic acid | 5:5 | 1.0 | 2.0 | 1.0 | 0.1 | A | C | C | C | C |
| 22 | 0.4 | Isopropanol | 95.6 | 4.0 | — | — | 5.0 | 0.5 | 9.0 | 0.2 | A | C | C | A | C |
| 23 | 0.4 | Propylene carbonate | 99.2 | 0.4 | — | — | 5.0 | 2.6 | 27.0 | 0.6 | A | C | B | A | C |
| 24 | 0.8 | | 98.4 | 0.8 | — | — | 5.0 | 3.0 | 40.0 | 0.6 | A | C | B | A | C |
| 25 | 1.1 | | 97.7 | 1.1 | | | 5.0 | 3.2 | 58.0 | 0.6 | A | C | B | A | C |
| 26 | 1.0 | | 99.1 | 0.0 | — | — | 5.0 | 0.7 | 8.0 | 0.2 | A | C | C | C | C |
| 27 | 0.1 | Methanol | 99.9 | 0.0 | — | — | 5.0 | 0.4 | 2.5 | 0.1 | B | C | C | C | — |
| 28 | 0.1 | | 98.9 | 1.0 | — | — | 5.0 | 0.4 | 3.5 | 0.3 | B | C | C | C | — |
| 29 | 0.1 | | 94.9 | 5.0 | — | — | 5.0 | 0.4 | 4.0 | 0.3 | B | C | C | C | — |
| 30 | 1.0 | | 99.0 | 0.0 | — | — | 5.0 | 2.0 | 11.6 | 0.1 | C | C | C | C | — |
| 31 | 1.0 | | 98.0 | 1.0 | — | — | 5.0 | 2.0 | 17.3 | 3.6 | C | C | C | B | C |
| 32 | 1.0 | | 94.0 | 5.0 | — | — | 5.0 | 2.0 | 23.1 | 3.7 | C | C | C | B | C |

TABLE 10-continued

| Comp. Ex. No. | HF mass % | Organic solvent Kind | mass % | Water mass % | Anticorrosive Kind | mass % | Treatment time min | Etching amount SiC Å | SiN Å | Etching amount ratio Sin/Low-k film | Corrosion Copper | Removability Resist | BARC | Residues | Profile |
|---|---|---|---|---|---|---|---|---|---|---|---|---|---|---|---|
| 33 | 5.0 |  | 95.0 | 0.0 | — | — | 5.0 | 2.3 | 8.3 | 0.2 | C | C | C | C | C |
| 34 | 5.0 |  | 94.0 | 1.0 | — | — | 5.0 | 2.2 | 8.6 | 0.3 | C | C | C | A | C |
| 35 | 5.0 |  | 90.0 | 5.0 | — | — | 5.0 | 2.2 | 62.9 | 4.0 | C | C | C | A | C |
| 36 | 0.1 | IPA | 99.9 | 0.0 | — | — | 5.0 | 0.4 | 0.8 | 0.1 | A | C | C | C | — |
| 37 | 0.1 |  | 98.9 | 1.0 | — | — | 5.0 | 0.4 | 1.2 | 0.2 | A | C | C | C | — |
| 38 | 0.1 |  | 94.9 | 5.0 | — | — | 5.0 | 0.4 | 1.3 | 0.3 | A | C | C | C | — |
| 39 | 1.0 |  | 99.0 | 0.0 | — | — | 5.0 | 2.2 | 2.9 | 0.2 | A | C | C | C | — |
| 40 | 5.0 |  | 95.0 | 0.0 | — | — | 5.0 | 2.0 | 3.9 | 0.3 | A | C | C | C | — |
| 41 | 5.0 |  | 94.0 | 1.0 | — | — | 5.0 | 0.8 | 21.0 | 0.5 | A | C | C | C | — |
| 42 | 0.003 | Acetic acid | 99.994 | 0.003 | — | — | 2.0 | 0.0 | 0.2 | 0.1 | A | C | C | C | — |
| 43 | 8.0 |  | 84.0 | 8.0 | — | — | 2.0 | 4.2 | 780.0 | 0.2 | A | C | A | A | C |

A: Excellent,
B: Good,
C: Poor,
—: No evaluation

TEST EXAMPLE 6

Cross-sectional Profile

The vertical cross-section of each treated substrate was observed by SEM in comparison with that of the untreated substrate to check the effects of the removing solutions on low-k film in Examples 67 to 83 and Comparative Examples 5 to 43. The profile of the substrate was substantially unchanged before and after the treatment with the removing solutions in Examples 67 to 83. It was thus confirmed that the low-k film was not damaged.

The removing solution of the present invention was found to be capable of removing resist, antireflection coating, and etching residues including these, without substantially damaging low-k film.

COMPARATIVE EXAMPLE 10

HF/H$_2$O=0.5 Mass %/99.5 Mass %

In Comparative Example 10, although it was possible to remove the resist and antireflection coating, the low-k film was damaged, being removed together with the resist and antireflection coating.

In Comparative Examples 5 to 9, 11, and 12, since the resist, antireflection coating, and etching residues including these were not removed, no evaluation was made in terms of profile. If treatment time is lengthened until they have been removed, the amount of etched low-k film will be increased. Since accurate processing cannot be performed, as intended, the obtained profile becomes extremely poor.

In Comparative Examples 13 to 43, there were some cases where since the resist, antireflection coating, and etching residues including these were not removed, no evaluation was made in terms of profile. In other cases, even when the resist or antireflection coating or etching residues including these were removed, the obtained profile was extremely poor.

The invention claimed is:

1. A resist-removing solution for low-k film consisting of 0.01 to 5 mass % of hydrogen fluoride (HF), 49 to 99.9 mass % of at least one member selected from the group consisting of organic acids and organic solvents, and 0 to 50 mass % of water, wherein the organic solvent is at least one member selected from the group consisting of monohydric alcohols, polyols, ketones, amides, nitriles, aldehydes, alkylene glycol monoalkyl ethers, ethers, esters, hydrocarbons, fluorinated alcohols and phosphate esters.

2. A resist-removing solution according to claim 1, that is free of water.

3. A removing solution according to claim 1, wherein the solution is used for ultrasonic cleaning.

4. A removing solution according to claim 1, wherein the low-k film has a dielectric constant greater than 1 but not greater than 3.

5. A removing solution according to claim 1, whereby a SiN film can be etched to a depth of at least 1 Å.

6. A removing solution according to claim 1, wherein the organic acids or organic solvents have an SP value of 7 to 17.

7. A removing solution according to claim 1, wherein said at least one member selected from the group consisting of organic acids and organic solvents is organic acid(s) or a mixture of organic acid(s) and organic solvent(s); and the concentration of HF is in the range of 0.01 to 5 mass %.

8. A removing solution according to claim 1, wherein the weight ratio of HF/organic acid/water is in the range of 0.01 to 5 mass %/49 to 99.9 mass %/0 to 50 mass %; and the organic acid is at least one member selected from the group consisting of monocarboxylic acids, sulfonic acids, and polycarboxylic acids.

9. A removing solution according to claim 8, wherein the monocarboxylic acids are at least one member selected from the group consisting of acetic acid, propionic acid, butyric acid, isobutyric acid, valeric acid, caproic acid, caprylic acid, monochloroacetic acid, dichloroacetic acid, trichloroacetic acid, monofluoroacetic acid, difluoroacetic acid, trifluoroacetic acid, α-chlorobutyric acid, βchlorobutyric acid, γ-chlorobutyric acid, lactic acid, glycolic acid, pyruvic acid, glyoxalic acid, methacrylic acid, and acrylic acid;

the sulfonic acids are at least one member selected from the group consisting of methanesulfonic acid, benzenesulfonic acid, trifluoromethanesulfonic acid, and toluenesulfonic acid; and the polycarboxylic acids are at least one member selected from the group consisting of oxalic acid, succinic acid, adipic acid, tartaric acid, and citric acid.

10. A removing solution according to claim 1, wherein the weight ratio of HF/organic solvent/water is in the range of 0.01 to 5 mass %/49 to 99.9 mass %/0 to 50 mass %.

11. A removing solution according to claim 1, wherein the monohydric alcohols are at least one member selected from the group consisting of methanol, ethanol, isopropanol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonyl alcohol, 1-decanol, 1-dodecanol, lauryl alcohol, and cyclohexanol, with the proviso that methanol and ethanol are used in combination with other organic solvent(s) or organic acid(s);

the polyols are at least one member selected from the group consisting of ethylene glycol, diethylene glycol, 1,2-propanediol, propylene glycol, 2,3-butanediol, and glycerin;

the ketones are at least one member selected from the group consisting of acetone, acetylacetone, methyl ethyl ketone, methyl isobutyl ketone, cyclohexanone, diethyl ketone, and diisobutyl ketone;

the amides are at least one member selected from the group consisting of N-methylformamide, N,N- dimethylformamide, N-methylacetamide, and N,N-dimethylacetamide;

the nitriles are at least one member selected from the group consisting of acetonitrile, propionitrile, butyronitrile, isobutyronitrile, and benzonitrile;

the aldehydes are at least one member selected from the group consisting of formaldehyde, acetaldehyde, and propionaldehyde;

the alkylene glycol monoalkyl ethers are at least one member selected from the group consisting of ethylene glycol monomethyl ether and ethylene glycol monoethyl ether;

the ethers are at least one member selected from the group consisting of tetrahydrofuran, dioxane, diisopropyl ether, dibutyl ether, tetrahydropyran, anisole, 1,2-dimethoxyethane, and diethylene glycol dimethyl ether;

the esters are at least one member selected from the group consisting of methyl acetate, ethyl acetate, propyl acetate, isopropyl acetate, butyl acetate, isobutyl acetate, pentyl acetate, hexyl acetate, methyl propionate, ethyl propionate, propyl propionate, isopropyl propionate, butyl propionate, isobutyl propionate, pentyl propionate, hexyl propionate, methyl butyrate, ethyl butyrate, propyl butyrate, isopropyl butyrate, butyl butyrate, isobutyl butyrate, pentyl butyrate, hexyl butyrate, methyl isobutyrate, ethyl isobutyrate, propyl isobutyrate, isopropyl isobutyrate, butyl isobutyrate, isobutyl isobutyrate, pentyl isobutyrate, hexyl isobutyrate, methyl valerate, ethyl valerate, propyl valerate, isopropyl valerate, butyl valerate, isobutyl valerate, pentyl valerate, hexyl valerate, methyl isovalerate, ethyl isovalerate, propyl isovalerate, isopropyl isovalerate, butyl isovalerate, isobutyl isovalerate, pentyl isovalerate, hexyl isovalerate, methyl caproate, ethyl caproate, propyl caproate, isopropyl caproate, butyl caproate, isobutyl caproate, pentyl caproate, hexyl caproate, methyl caprylate, ethyl caprylate, propyl caprylate, isopropyl caprylate, butyl caprylate, isobutyl caprylate, pentyl caprylate, hexyl caprylate, methyl octanoate, ethyl octanoate, propyl octanoate, isopropyl octanoate, butyl octanoate, isobutyl octanoate, pentyl octanoate, hexyl octanoate, methyl nonanoate, ethyl nonanoate, propyl nonanoate, isopropyl nonanoate, butyl nonanoate, isobutyl nonanoate, pentyl nonanoate, hexyl nonanoate, methyl decanoate, ethyl decanoate, propyl decanoate, isopropyl decanoate, butyl decanoate, isobutyl decanoate, pentyl decanoate, hexyl decanoate, methyl dodecanoate, ethyl dodecanoate, propyl dodecanoate, isopropyl dodecanoate, butyl dodecanoate, isobutyl dodecanoate, pentyl dodecanoate, hexyl dodecanoate, methyl laurate, ethyl laurate, propyl laurate, isopropyl laurate, butyl laurate, isobutyl laurate, pentyl laurate, hexyl laurate, methyl acrylate, ethyl acrylate, propyl acrylate, isopropyl acrylate, butyl acrylate, isobutyl acrylate, pentyl acrylate, hexyl acrylate, monomethyl oxalate, dimethyl oxalate, monoethyl oxalate, diethyl oxalate, monopropyl oxalate, dipropyl oxalate, monobutyl oxalate, dibutyl oxalate, monomethyl succinate, dimethyl succinate, monoethyl succinate, diethyl succinate, monopropyl succinate, dipropyl succinate, monobutyl succinate, dibutyl succinate, monomethyl adipate, dimethyl adipate, monoethyl adipate, diethyl adipate, monopropyl adipate, dipropyl adipate, monobutyl adipate, dibutyl adipate, monomethyl tartrate, dimethyl tartrate, monoethyl tartrate, diethyl tartrate, monopropyl tartrate, dipropyl tartrate, monobutyl tartrate, dibutyl tartrate, monomethyl citrate, dimethyl citrate, monoethyl citrate, diethyl citrate, monopropyl citrate, dipropyl citrate, monobutyl citrate, dibutyl citrate, dimethyl phthalate, diethyl phthalate, dipropyl phthalate, dibutyl phthalate, dipentyl phthalate, dihexyl phthalate, diheptyl phthalate, dioctyl phthalate, dinonyl phthalate, didecyl phthalate, didodecyl phthalate, dimethyl terephthalate, diethyl terephthalate, dipropyl terephthalate, dibutyl terephthalate, dipentyl terephthalate, dihexyl terephthalate, diheptyl terephthalate, dioctyl terephthalate, dinonyl terephthalate, didecyl terephthalate, didodecyl terephthalate, propylene carbonate, and γ-butyrolactone;

the hydrocarbons are at least one member selected from the group consisting of hexane, cyclohexane, octane, isooctane, benzene, and toluene;

the fluorinated alcohols are at least one member selected from the group consisting of trifluoroethanol, pentafluoropropanol, and 2,2,3,3-tetrafluoropropanol; and the phosphate esters are at least one member selected from the group consisting of dimethyl phosphate, dibutyl phosphate, diphenyl phosphate, dibenzyl phosphate, trimethyl phosphate, triethyl phosphate, tripropyl phosphate, tributyl phosphate, and triphenyl phosphate.

12. A resist-removing solution according to claim 1, wherein the solution etches, in a treatment time of 0.1 to 120 minutes, (1) an insulating film barrier to a depth of 1 to 200 Å, (2) low-k film to a depth of 1 to 200 Å, and (3) Cu at an etching rate of no more than 10 Å/min; and the solution removes resist, antireflection coating, filling material, and etching residue including these, after dry etching in the formation of damascene and dual damascene structures for Cu/low-k multilevel interconnection.

13. A removing solution according to claim 12, wherein the insulating film barrier and the low-k film are Si-containing compounds such as SiN, SiC, SiCN, SiOC, and $SiO_2$.

14. A removing solution according to claim 12, wherein the solution removes residue resulting from etching with a nitrogen-containing etching gas, regardless of whether plasma ashing is conducted or not.

15. A removing solution according to claim 12, wherein the solution removes residue after ashing with a nitrogen-containing gas.

16. A removing solution according to claim 12, wherein one or more inert gases are dissolved in the solution such that the oxygen partial pressure in the solution is below the oxygen partial pressure in air-saturated solution.

17. A removing solution according to claim 12, consisting of (i) HF, (ii) a protogenic solvent, and (iii) at least one organic compound selected from the group consisting of polar protophilic solvents and polar protophobic solvents having a donor number of no more than 24, and neutral solvents; wherein the weight ratio of (i) HF (hydrogen fluoride)/(ii) protogenic solvent/(iii) said at least one organic compound selected from the group consisting of polar protophilic solvents and polar protophobic solvents having a donor number of no more than 24, and neutral solvents is in the range of (i) 0.05 to 5 mass %/(ii) 1 to 98.95 mass %/(iii) 1 to 98.95 mass %.

18. A removing solution according to claim 12, consisting of (i) HF, (ii) a protogenic solvent, and (iii) at least one organic compound selected from the group consisting of polar protophilic solvents and polar protophobic solvents having a donor number of no more than 24, and neutral solvents, and (iv) water; wherein the weight ratio of (i) HF (hydrogen fluoride)/(ii) protogenic solvent/(iii) said at least one organic compound selected from the group consisting of polar protophilic solvents and polar protophobic solvents having a donor number of no more than 24, and neutral solvents/(iv) water is in the range of (i) 0.05 to 5 mass %/(ii) 1 to 98.93 mass %/(iii) 1 to 98.93 mass %/(iv) 0.02 to 90 mass %.

19. A removing solution according to claim 12, consisting of (i) HF, (ii) a protogenic solvent, (iii) at least one organic compound selected from the group consisting of polar protophilic solvents and polar protophobic solvents having a donor number of no more than 24, and neutral solvents, (iv) water, and at least one member selected from the group consisting of (v) organic acids, (vi) polar protophilic solvents having a donor number of at least 25, and (vii) hydrofluoroethers or hydrochlorofluorocarbons; wherein the weight ratio of (i) HF/(ii) protogenic solvent/(iii) said at least one organic compound selected from the group consisting of polar protophilic solvents and polar protophobic solvents having a donor number of no more than 24, and neutral solvents/(iv) water/(v) organic acid/(vi) polar protophilic solvent having a donor number of at least 25/(vii) hydrofluoroethers or hydrochlorofluorocarbons is in the range of (i) 0.05 to 5 mass %/(ii) 1 to 98.83 mass %/(iii) 1 to 98.83 mass %/(iv) 0.02 to 90 mass %/(v) 0 to 10 mass %/(vi) 0 to 50 mass %/(vii) 0 to 70 mass %, with the total amount of acid, polar protophilic solvent having a donor number of at least 25, hydrofluoroethers and hydrochlorofluorocarbons being 0.1 to 74.93 mass %.

20. A removing solution according to claim 12, consisting of (i) HF, (ii) at least one organic compound selected from the group consisting of polar protophilic solvents and polar protophobic solvents having a donor number of no more than 24, neutral solvents, and protogenic solvents, and (iii) water; wherein the weight ratio of (i) HF (hydrogen fluoride)/(ii) said at least one organic compound selected from the group consisting of polar protophilic solvents and polar protophobic solvents having a donor number of no more than 24, neutral solvents, and protogenic solvents/(iii) water is in the range of (i) 0.05 to 5 mass %/(ii) 85 to 99.93 mass %/(iii) 0.02 to 10 mass %.

21. A removing solution according to claim 12, consisting of (i) HF, (ii) at least one organic compound selected from the group consisting of polar protophilic solvents and polar protophobic solvents having a donor number of no more than 24, neutral solvents, and protogenic solvents, (iii) water, and at least one member selected from the group consisting of (iv) organic acids, (v) polar protophilic solvents having a donor number of at least 25, and (vi) hydrofluoroethers or hydrofluorocarbons; wherein the weight ratio of (i) HF/(ii) said at least one organic compound selected from the group consisting of polar protophilic solvents and polar protophobic solvents having a donor number of no more than 24, neutral solvents, and protogenic solvents/(iii) water/(iv) organic acid/(v) polar protophilic solvent having a donor number of at least 25/(vi) hydrofluoroethers or hydrochlorofluorocarbons is in the range of (i) 0.05 to 5 mass %/(ii) 25 to 99.83 mass %/(iii) 0.02 to 10 mass %/(iv) 0 to 10 mass %/(v) 0 to 50 mass %/(vi) 0 to 70 mass %, with the total amount of acid, polar protophilic solvent having a donor number of at least 25, hydrofluoroethers and hydrochlorofluorocarbons being 0.1 to 74.93 mass %.

22. A removing solution according to claim 17, wherein the neutral solvents are alcohols; the protogenic solvents are monocarboxylic acids, polycarboxylic acids, and sulfonic acids; and the polar aprotoic solvents having a donor number of no more than 24 are esters and ethers; and the polar protophilic solvents having a donor number of at least 25 are esters, ethers, ketones, and acid anhydrides.

23. A removing solution according to claim 22, wherein (I) as the neutral solvents, the alcohols are methyl alcohol, ethyl alcohol, propanol, isopropanol, t-butanol, allyl alcohol, and ethylene glycol;
  (II) as the protogenic solvents, the monocarboxylic acids are formic acid, acetic acid, propionic acid, butyric acid, isobutyric acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, pyruvic acid, glyoxalic acid, methacrylic acid, and acrylic acid; the polycarboxylic acids are oxalic acid, succinic acid, adipic acid, and citric acid; and the sulfonic acids are methanesulfonic acid, benzenesulfonic acid, toluenesulfonic acid, and trifluoromethanesulfonic acid;
  (III) as the polar protophilic solvents having a donor number of no more than 24, the esters are tributyl phosphate and trimethyl phosphate; the ethers are 1,2-dimethoxyethane, tetrahydrofuran, diethyl ether, ethylene glycol monomethyl ether, ethylene glycol monoethyl ether, dimethoxymethane, dimethoxypropane, diethoxymethane, and 1,1-dimethoxyethane;
  (IV) as the polar protophobic solvents, the esters are methyl acetate, ethyl acetate, butyl acetate, propylene carbonate, ethylene carbonate, ethylene sulfite, and lactone; the ethers are dioxane, trioxane, and diglyme; the ketones are acetone; and the acid anhydrides are acetic anhydride.

24. A removing solution according to claim 19, wherein the hydrofluoroethers are $CHF_2CF_2OCH_2CF_3$ or $CHF_2CF_2OCH_4$; and hydrochlorofluorocarbons are $CH_3CCl_2F$ or $CClF_2CF_2CHClF$.

25. A removing solution according to claim 19, wherein the polar protophilic solvents having a donor number of at least 25 are at least one member selected from the group consisting of amides such as dimethylformamide, dimethylacetamide, hexamethylphosphoric triamide, N-methyl-2-pyrrolidone, 1,1,3,3-tetramethylurea, N-methylpropionamide, and dimethyl imidazolidinone; and sulfur compounds such as dimethyl sulfoxide, sulfolane, dimethylthioformamide, and N-methylthiopyrrolidone.

26. A removing solution according to claim 17, wherein the solution comprises a carboxylic acid as a protogenic solvent;

and at least one member selected from the group consisting of alcohols as neutral solvents, and esters and ethers as polar aprotic solvents having a donor number of no more than 24.

27. A removing solution according to claim 26, wherein the carboxylic acid is acetic acid.

28. A removing solution according to claim 22, wherein the solution comprises an alcohol as a neutral solvent; and at least one member selected from the group consisting of esters and ethers as polar aprotic solvents having a donor number of no more than 24.

29. A removing solution according to claim 22, wherein the alcohols are at least one member selected from the group consisting of propanol, isopropanol, t-butanol, allyl alcohol, and ethylene glycol.

30. A removing solution according to claim 17, wherein the solution comprises at least one member selected from the group consisting of esters and ethers as polar aprotic solvents having a donor number of no more than 24.

31. A removing solution according to claim 17, wherein the esters are at least one member selected from the group consisting of methyl acetate, ethyl acetate, butyl acetate, propylene carbonate, and ethylene carbonate; and the ethers are at least one member selected from the group consisting of 1,2-dimethoxyethane, tetrahydrofuran, dioxane, trioxane, diglyme, ethylene glycol monomethyl ether, ethylene glycol diethyl ether, diethylene glycol methyl ethyl ether, tetraethylene glycol dimethyl ether, polyethylene glycol dimethyl ether, ethylene glycol monoallyl ether, diethylene glycol monobutyl ether, ethylene glycol butyl ether, triethylene glycol monobutyl ether, diethylene glycol diethyl ether, diethylene glycol dimethyl ether, triethylene glycol dimethyl ether, diethylene glycol monoisobutyl ether, ethylene glycol monoisobutyl ether, ethylene glycol monoisopropyl ether, diethylene glycol monomethyl ether, dipropylene glycol monomethyl ether, propylene glycol monomethyl ether, tripropylene glycol monomethyl ether, ethylene glycol monoethyl ether, polyethylene glycol monomethyl ether, triethylene glycol monomethyl ether, propylene glycol monopropyl ether, and ethylene glycol methyl ethyl ether.

32. A removing solution according to claim 20, consisting of HF, acetic acid, and water; wherein the weight ratio of HF/acetic acid/water is in the range of 0.05 to 5 mass %/85 to 99.93 mass %/0.02 to 10 mass %.

33. A removing solution according to claim 20, consisting of HF, isopropanol, and water; wherein the weight ratio of HF/isopropanol/water is in the range of 1 to 5 mass %/88 to 98.5 mass %/0.5 to 5 mass %.

34. A removing solution according to claim 20, consisting of HF, acetic acid, isopropanol, and water; wherein the weight ratio of HF/acetic acid/isopropanol/water is in the range of 0.05 to 5 mass %/1 to 98.93 mass %/1 to 98.85 mass %/0.02 to 12 mass %.

35. A removing solution according to claim 20, consisting of HF, 1,2-dimethoxyethane, and water; wherein the weight ratio of HF/1,2-dimethoxyethane/water is in the range of 0.50 to 5 mass %/85.00 to 99.3 mass %/0.02 to 10 mass %.

36. A removing solution according to claim 20, consisting of HF; at least one member selected from the group consisting of methyl acetate, ethyl acetate, and butyl acetate; and water; wherein the weight ratio of HF/said at least one member selected from the group consisting of methyl acetate, ethyl acetate, and butyl acetate/water is in the range of 0.50 to 5 mass %/85.00 to 99.30 mass %/0.02 to 10 mass %.

37. A removing solution according to claim 20, consisting of HF, 1,4-dioxane, and water; wherein the weight ratio of HF/1,4-dioxane/water is in the range of 0.50 to 5 mass %/85.00 to 99.3 mass %/0.2 to 10 mass %.

38. A removing solution according to claim 20, consisting of HF; 1,4-dioxane and at least one member selected from the group consisting of acetic anhydride and acetic acid; and water; wherein the weight ratio of HF/1,4-dioxane and said at least one member selected from the group consisting of acetic anhydride and acetic acid/water is in the range of 0.50 to 6 mass %/82.00 to 99.30 mass %/0.2 to 12 mass %.

39. A removing solution according to claim 20, consisting of HF; at least one member selected from the group consisting of ethylene glycol monomethyl ether, ethylene glycol diethyl ether, diethylene glycol methyl ethyl ether, tetraethylene glycol dimethyl ether, polyethylene glycol dimethyl ether, ethylene glycol monoallyl ether, diethylene glycol monobutyl ether, ethylene glycol butyl ether, triethylene glycol monobutyl ether, diethylene glycol diethyl ether, diethylene glycol dimethyl ether, triethylene glycol dimethyl ether, diethylene glycol monoisobutyl ether, ethylene glycol monoisobutyl ether, ethylene glycol monoisopropyl ether, diethylene glycol monomethyl ether, dipropylene glycol monomethyl ether, propylene glycol monomethyl ether, tripropylene glycol monomethyl ether, ethylene glycol monoethyl ether, polyethylene glycol monomethyl ether, triethylene glycol monomethyl ether, propylene glycol monopropyl ether, and ethylene glycol methyl ethyl ether; and water;

wherein the weight ratio of HF/said at least one member selected from the group consisting of ethylene glycol monomethyl ether, ethylene glycol diethyl ether, diethylene glycol methyl ethyl ether, tetraethylene glycol dimethyl ether, polyethylene glycol dimethyl ether, ethylene glycol monoallyl ether, diethylene glycol monobutyl ether, ethylene glycol butyl ether, triethylene glycol monobutyl ether, diethylene glycol diethyl ether, diethylene glycol dimethyl ether, triethylene glycol dimethyl ether, diethylene glycol monoisobutyl ether, ethylene glycol monoisobutyl ether, ethylene glycol monoisopropyl ether, diethylene glycol monomethyl ether, dipropylene glycol monomethyl ether, propylene glycol monomethyl ether, tripropylene glycol monomethyl ether, ethylene glycol monoethyl ether, polyethylene glycol monomethyl ether, triethylene glycol monomethyl ether, propylene glycol monopropyl ether, and ethylene glycol methyl ethyl ether/water is in the range of 0.50 to 5 mass %/85.00 to 99.30 mass %/0.20 to 10 mass %.

40. A removing solution according to claim 12, consisting of HF, methanesulfonic acid, and water; wherein the weight ratio of HF/methanesulfonic acid/water is in the range of 0.01 to 5 mass %/at least 45 and less than 100 mass %/more than 0 and not more than 50 mass %.

41. A removing method comprising removing etching residue while leaving low-k film that has been damaged by a plasma process, by the use of the removing solution of claim 1.

* * * * *